United States Patent
Teyeb et al.

(10) Patent No.: US 10,993,153 B2
(45) Date of Patent: Apr. 27, 2021

(54) MEASUREMENT GAP COMMUNICATION

(71) Applicant: Telefonaktiebolaget LM Ericsson (publ), Stockholm (SE)

(72) Inventors: Oumer Teyeb, Solna (SE); Matteo Fiorani, Solna (SE); Parisa Pakniat, Norrköping (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 104 days.

(21) Appl. No.: 16/341,572

(22) PCT Filed: Apr. 2, 2019

(86) PCT No.: PCT/SE2019/050302
§ 371 (c)(1),
(2) Date: Apr. 12, 2019

(87) PCT Pub. No.: WO2019/194729
PCT Pub. Date: Oct. 10, 2019

(65) Prior Publication Data
US 2020/0128454 A1    Apr. 23, 2020

Related U.S. Application Data

(60) Provisional application No. 62/653,040, filed on Apr. 5, 2018.

(51) Int. Cl.
*H04W 36/00*    (2009.01)
*G01R 31/3183*    (2006.01)

(52) U.S. Cl.
CPC .............. *H04W 36/0069* (2018.08); *G01R 31/318342* (2013.01); *H04W 36/0088* (2013.01)

(58) Field of Classification Search
CPC .............. H04W 72/12; H04W 36/00
See application file for complete search history.

(56) References Cited

U.S. PATENT DOCUMENTS

| 2018/0124612 | A1* | 5/2018 | Babaei | H04W 16/14 |
| 2019/0075585 | A1* | 3/2019 | Deogun | H04L 5/0092 |
| 2020/0077288 | A1* | 3/2020 | Tsuboi | H04W 24/10 |
| 2020/0077312 | A1* | 3/2020 | Tsuboi | H04W 36/0088 |
| 2020/0169906 | A1* | 5/2020 | Tsuboi | H04W 80/08 |

OTHER PUBLICATIONS

"Correction of SgNB Initiated SN Modification procedure for Measurement Gap", 3GPP TSG-RAN WG3 #101bis; R3-186196; Chengdu, China; Oct. 8-12, 2018, pp. 1-5.

(Continued)

*Primary Examiner* — Kent Krueger
(74) *Attorney, Agent, or Firm* — Sage Patent Group

(57) ABSTRACT

A method performed by a network node operating as a master node (MN) in dual connectivity with a secondary node (SN) for measurement gap configuration, comprises receiving a notification from the secondary node that it will perform a secondary node modification procedure; determining that a measurement gap configuration or reconfiguration is required; and sending a response message to the secondary node in response to said notification, wherein said message includes a gap configuration information.

19 Claims, 16 Drawing Sheets

---

1002
Send a notification to the master node that it will perform a secondary node amendment procedure

1004
Receive a message from the master node in response to said notification, wherein said message includes gap configuration information

1006
Use said gap configuration information in communications with a wireless device

(56) References Cited

OTHER PUBLICATIONS

"Correction of SN Initiated SN Modification procedure for Measurement Gap", 3GPP TSG-RAN WG2 Meeting #104; R2-1817595; Spokane, USA; Nov. 12-17, 2018, pp. 1-6.
"SgNB Initiated SN Modification procedure for Measurement Gap", 3GPP TSG-RAN WG3 #101bis; R3-185713; Chengdu, China; Oct. 8-12, 2018, pp. 1-2.
"Summary of email discussion [99#49] on MN/SN procedures", 3GPP TSG-RAN WG2 #99bis; R2-1711527; Prague, Czech Republic; Oct. 9-13, 2017, pp. 1-17.
"Discussion on the Configuration of Measurement Gap", 3GPP TSG-RAN WG2 #100; R2-1712602; Reno, USA; Nov. 27-Dec. 1, 2017, pp. 1-12.
"3GPP TS 38.331 V15.0.0", 3rd Generation Partnership Project; Technical Specification Group Radio Access Network NR Radio Resource Control (RRC) protocol specification (Release 15), Dec. 2017, pp. 1-51.
"3GPP TS 36.300 V15.0.0", 3rd Generation Partnership Project; Technical Specification Group Radio Access Network; Evolved Universal Terrestrial Radio Access (E-UTRA) and Evolved Universal Terrestrial Radio Access Network (E-UTRAN); Overall description; Stage 2 (Release 15), Dec. 2017, pp. 1-338.
"3GPP TS 38.401 V15.0.0", 3rd Generation Partnership Project; Technical Specification Group Radio Access Network; NG-RAN; Architecture description (Release 15), Dec. 2017, pp. 1-23.
"3GPP TS 38.133 V15.0.0", 3rd Generation Partnership Project; Technical Specification Group Radio Access Network; NR; Requirements for support of radio resource management (Release 15), Dec. 2017, pp. 1-41.
"3GPP TS 23.501 V15.1.0", 3rd Generation Partnership Project; Technical Specification Group Services and System Aspects; System Architecture for the 5G System; Stage 2 (Release 15), Mar. 2018, pp. 1-201.
"3GPP TS 33.401 V15.3.0", 3rd Generation Partnership Project; Technical Specification Group Services and System Aspects; 3GPP System Architecture Evolution (SAE); Security architecture (Release 15), Mar. 2018, pp. 1-163.
"3GPP TS 36.423 V15.0.0", 3rd Generation Partnership Project; Technical Specification Group Radio Access Network; Evolved Universal Terrestrial Radio Access Network; (E-UTRAN); X2 application protocol (X2AP); (Release 15), Dec. 2017, pp. 1-38.
"3GPP TS 38.401 V15.1.0", 3rd Generation Partnership Project; Technical Specification Group Radio Access Network; NG-RAN; Architecture description (Release 15), Mar. 2018, pp. 1-23.
"3GPP TS 38.473 V15.0.0", 3rd Generation Partnership Project; Technical Specification Group Radio Access Network; NG-RAN; F1 application protocol (F1AP); (Release 15), Dec. 2017, pp. 1-90.

* cited by examiner

LTE DC
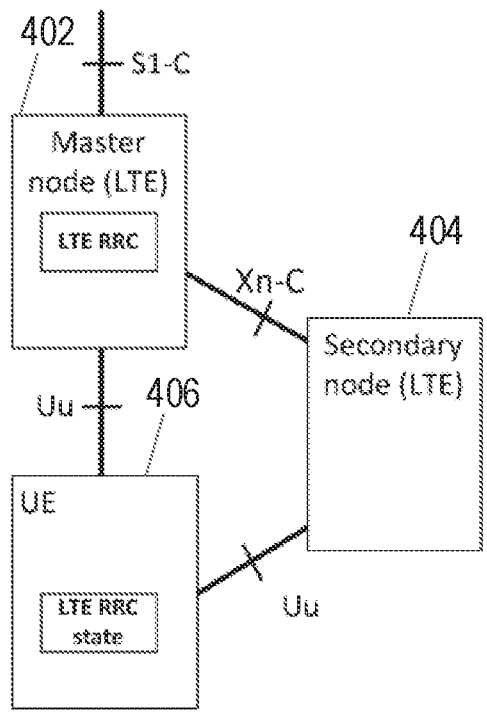
EN-DC
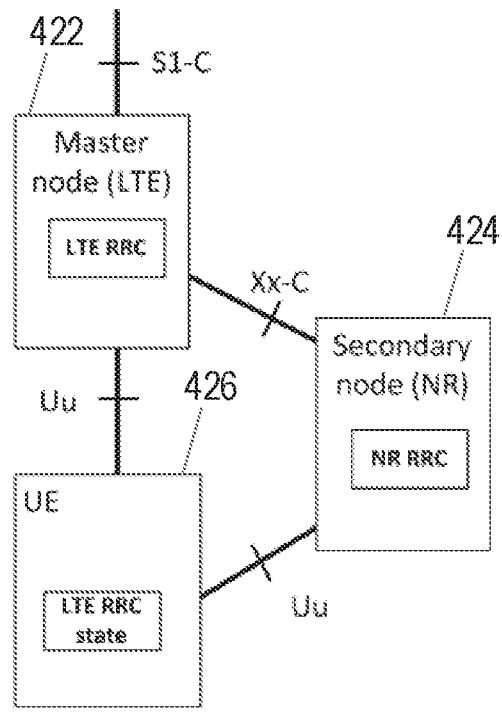
(a)     (b)
Fig. 4

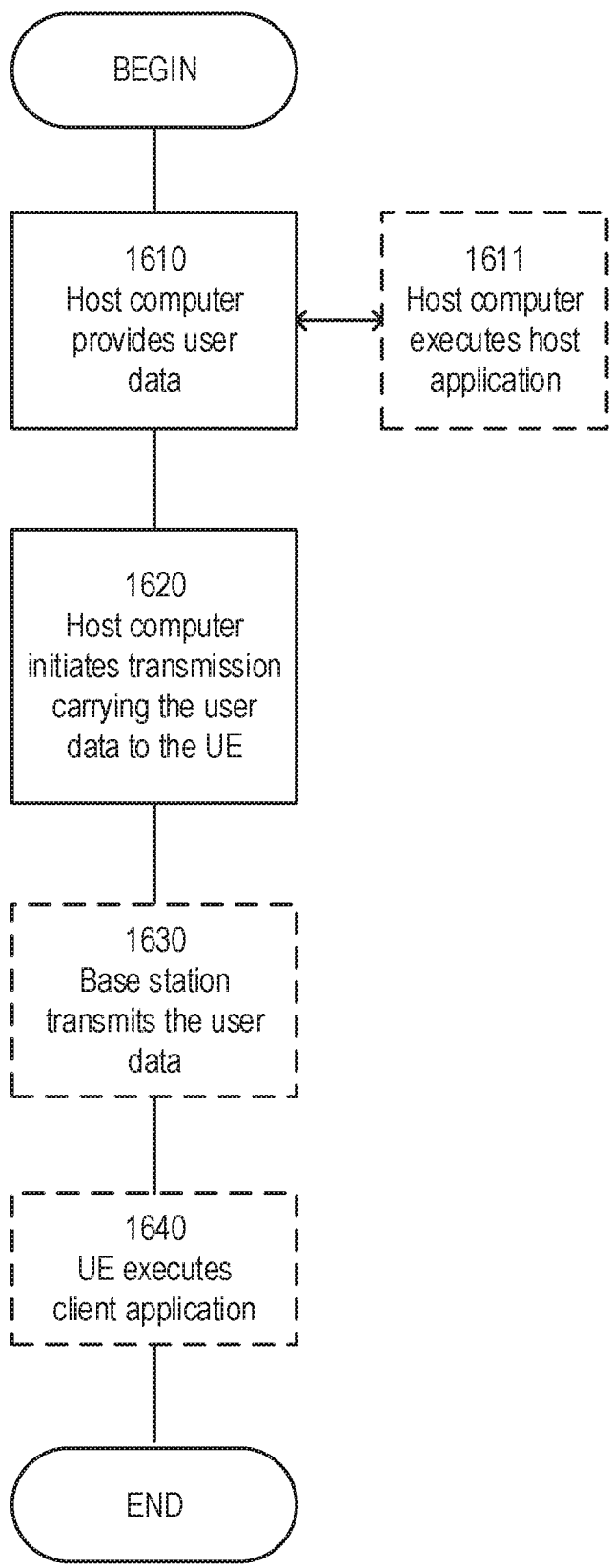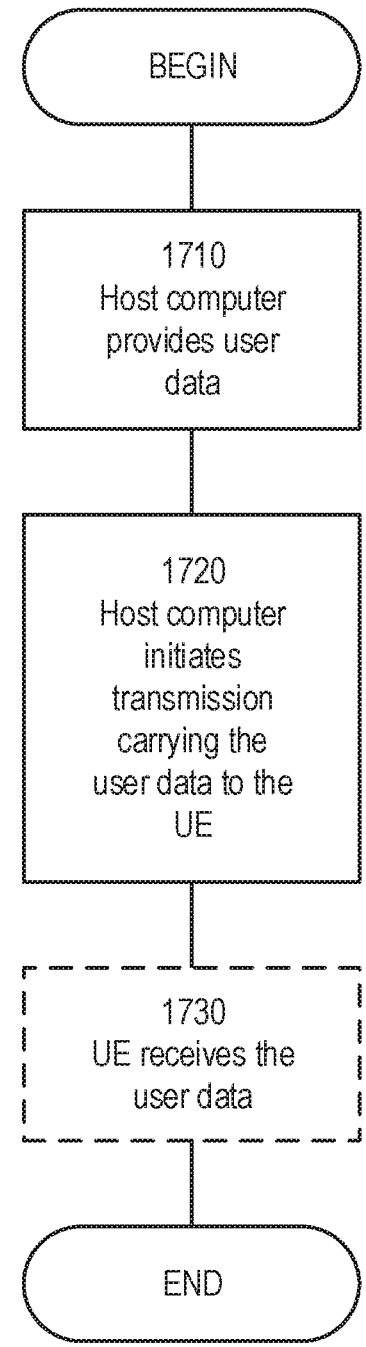
Fig. 16
Fig. 17

MEASUREMENT GAP COMMUNICATION

TECHNICAL FIELD

This relates to mobile communications networks, and in particular to the configuration of measurement gaps in the case of dual connectivity.

BACKGROUND

A mobile communication system supports Dual Connectivity (DC) operation, whereby a User Equipment (UE) is configured to utilize radio resources provided by two distinct schedulers, located in two radio base stations (eNBs), which are connected to each other over an interface.

A radio base station involved in Dual Connectivity operation for a certain UE may assume two different roles. Specifically, an eNB may either act as a Master node (MN), also referred to as Master eNB (MeNB), or as a Secondary node (SN), also referred to as Secondary eNB (SeNB). A UE is connected to one MN and one SN. During measurement gaps, a UE performs measurements on the signals that it can detect, and so it is unable to detect transmissions that are sent to it.

Several secondary node amendment procedures exist, for example a Secondary Node Addition procedure, and a Secondary Node Modification procedure. In each of these secondary node amendment procedures, the SN informs the MN when it configures measurements. This can be in an Information Element (IE) included in one of the following messages:

1. SgNB addition request acknowledge, or
2. SgNB modification request acknowledge, or
3. SgNB modification required.

The first two messages are defined as response messages in class-1 procedures. Therefore, the MN does not provide any reply. However, the MN after receiving a positive response from the UE, will send the following message to the SN:

SgNB reconfiguration complete (after the MN has received the RRC complete message from the UE, in the procedures initiated by the MN).

The third message is part of a class-1 procedure according to which the MN provides to the SN the following response message:

SgNB modification confirm (after the MN has received the RRC complete message from the UE, in the procedure initiated by the SN).

However, the gap information is provided to the SN as part of an IE that is included in one of the following messages:

1. SgNB addition request, or
2. SgNB modification request.

Thus, there currently exist certain challenge(s). The implication of this description above is that, in order for the MN to indicate the measurement gaps to the SN, it has to initiate a (probably dummy) SgNB modification request procedure as neither the SgNB reconfiguration complete or the SgNB modification confirm messages can be utilized to indicate the gaps.

This leads to the problem that, from the moment the UE has received the measurement configuration, the UE will apply the measurement gap configurations, while the SN has to wait for the rest of the procedures to finish and then receive a dummy SgNB modification request message that includes the gap configuration before it becomes aware of the new/updated gap information. This means that, during this time period, as the SN is not aware of the gap configured by the MN and applied by the UE, it might end up sending data to the UE while the UE's gap is on and UE is performing measurements and not listening to the transmission of the SN.

SUMMARY

According to a first aspect, there is provided a method performed by a network node operating as a master node (MN) in dual connectivity with a secondary node (SN) for measurement gap configuration, the method comprising:
receiving a notification from the secondary node that it will perform a secondary node amendment procedure; and
sending a message to the secondary node in response to said notification, wherein said message includes gap configuration information.

The method may comprise, after receiving a notification from the secondary node that it will perform a secondary node amendment procedure, determining that a measurement gap configuration or reconfiguration is required, and sending said message to the secondary node in response to said notification only if it is determined that a measurement gap configuration or reconfiguration is required.

The method may comprise: performing a separate procedure after receiving said notification; and sending the message to the secondary node after performing the separate procedure. In that case, performing the separate procedure may comprise performing a Radio Resource Control reconfiguration procedure with a wireless device.

In some embodiments, said notification is a Secondary gNB (sgNB) Addition Request Acknowledge message; and sending the message to the secondary node comprises sending a SgNB Reconfiguration Complete message.

In some other embodiments, said notification is a Secondary gNB (sgNB) Modification Request Acknowledge message; and sending the message to the secondary node comprises sending a SgNB Reconfiguration Complete message.

In some other embodiments, said notification is a Secondary gNB (sgNB) Modification Required message; and sending the message to the secondary node comprises sending a SgNB Modification Confirm message.

The method may comprise sending the message to the secondary node immediately after receiving said notification.

The notification may be a Secondary gNB (sgNB) Addition Request Acknowledge message.

The notification may be a Secondary gNB (sgNB) Modification Request Acknowledge message. In that case, sending the message to the secondary node may comprise sending a SgNB Reconfiguration Complete message.

The notification may be a Secondary gNB (sgNB) Modification Required message. In that case, sending the message to the secondary node may comprise sending a SgNB Modification Request message.

The method may further comprise: performing a Radio Resource Control reconfiguration procedure with a wireless device after sending the message to the secondary node.

According to a second aspect, there is provided a method performed by a network node operating as a secondary node (SN) in dual connectivity with a master node (MN) for measurement gap configuration, the method comprising:
sending a notification to the master node that it will perform a secondary node amendment procedure;

receiving a message from the master node in response to said notification, wherein said message includes gap configuration information; and using said gap configuration information in communications with a wireless device.

In some embodiments, said notification is a Secondary gNB (sgNB) Addition Request Acknowledge message; and the message received from the master node is a SgNB Reconfiguration Complete message.

In some other embodiments, said notification is a Secondary gNB (sgNB) Modification Request Acknowledge message; and the message received from the master node is a SgNB Reconfiguration Complete message.

In some other embodiments, said notification is a Secondary gNB (sgNB) Modification Required message; and the message received from the master node is a SgNB Modification Confirm message.

In some other embodiments, said notification is a Secondary gNB (sgNB) Modification Required message; and the message received from the master node is a SgNB Modification Request message.

The method may further comprise: after determining that it will perform a secondary node amendment procedure, pausing transmissions to a wireless device operating with said dual connectivity; and resuming transmissions to said wireless device after receiving said message from the master node including gap configuration information.

The method of any of the previous aspects may further comprise:
obtaining user data; and
forwarding the user data to a host computer or a wireless device.

According to a third aspect, there is provided a base station for operating in dual connectivity, the base station comprising: processing circuitry configured to perform any of the steps of any of the first or second aspects.

The base station may further comprise power supply circuitry configured to supply power to the base station.

According to a further aspect, there is provided a communication system including a host computer comprising:
processing circuitry configured to provide user data; and
a communication interface configured to forward the user data to a cellular network for transmission to a user equipment (UE),
wherein the cellular network comprises a base station having a radio interface and processing circuitry, the base station's processing circuitry configured to perform any of the steps of any of the first and second aspects.

The communication system may further include the base station.

The communication system may further include the UE, wherein the UE is configured to communicate with the base station.

In the communication system,
the processing circuitry of the host computer may be configured to execute a host application, thereby providing the user data; and
the UE may comprise processing circuitry configured to execute a client application associated with the host application.

According to a further aspect, there is provided a method implemented in a communication system including a host computer, a base station and a user equipment (UE), the method comprising:

at the host computer, providing user data; and
at the host computer, initiating a transmission carrying the user data to the UE via a cellular network comprising the base station, wherein the base station performs any of the steps of any of the first and second aspects.

The method may further comprise, at the base station, transmitting the user data.

The user data may be provided at the host computer by executing a host application, the method further comprising, at the UE, executing a client application associated with the host application.

According to a further aspect, there is provided a communication system including a host computer comprising a communication interface configured to receive user data originating from a transmission from a user equipment (UE) to a base station, wherein the base station comprises a radio interface and processing circuitry, the base station's processing circuitry configured to perform any of the steps of any of the first and second aspects.

The communication system may further include the base station.

The communication system may further include the UE, wherein the UE is configured to communicate with the base station.

In the communication system:
the processing circuitry of the host computer may be configured to execute a host application;
the UE may be configured to execute a client application associated with the host application, thereby providing the user data to be received by the host computer.

Thus, certain embodiments may provide the technical advantage of enabling a robust way of configuring measurement gaps in EN-DC.

Certain embodiments present solutions for a faster and more efficient exchange of measurement gap information for NR measurements between the MN and SN so that unnecessary data loss/retransmissions are prevented, also avoiding unnecessary inter-node signaling.

More specifically, this may be realized in one or more of the following several ways:

1. By enabling the SgNB reconfiguration complete and SgNB modification confirm messages to include the gap configuration.

2. By introducing a new message from the MN to the SN that is used for fast communication of the measurement gap configuration.

3. By pausing the transmission from the SN towards the UE when the SN has updated the measurement configuration and anticipates a possible gap (re)configuration from the MN, until an updated gap configuration is received from the MN or until an SgNB Reconfiguration Complete message is received containing the RRC-Reconfiguration-Complete message from the UE.

4. In the SN initiated SN Modification procedure, the SgNB Modification Request procedure can be used to provide the new gaps and updated maximum allowed number of measurement to the SN. This requires some changes in the definition of this procedure.

BRIEF DESCRIPTION OF DRAWINGS

FIG. 4 illustrates a further part of a communications network in accordance with an aspect of the disclosure.

FIG. 16 is a flow chart, illustrating a method in accordance with the disclosure.

FIG. 17 is a flow chart, illustrating a method in accordance with the disclosure.

DETAILED DESCRIPTION

Some of the embodiments contemplated herein will now be described more fully with reference to the accompanying drawings. Other embodiments, however, are contained within the scope of the subject matter disclosed herein, the disclosed subject matter should not be construed as limited to only the embodiments set forth herein; rather, these embodiments are provided by way of example to convey the scope of the subject matter to those skilled in the art.

Generally, all terms used herein are to be interpreted according to their ordinary meaning in the relevant technical field, unless a different meaning is clearly given and/or is implied from the context in which it is used. All references to a/an/the element, apparatus, component, means, step, etc. are to be interpreted openly as referring to at least one instance of the element, apparatus, component, means, step, etc., unless explicitly stated otherwise. The steps of any methods disclosed herein do not have to be performed in the exact order disclosed, unless a step is explicitly described as following or preceding another step and/or where it is implicit that a step must follow or precede another step. Any feature of any of the embodiments disclosed herein may be applied to any other embodiment, wherever appropriate. Likewise, any advantage of any of the embodiments may apply to any other embodiments, and vice versa. Other objectives, features and advantages of the enclosed embodiments will be apparent from the following description.

Figure 1:
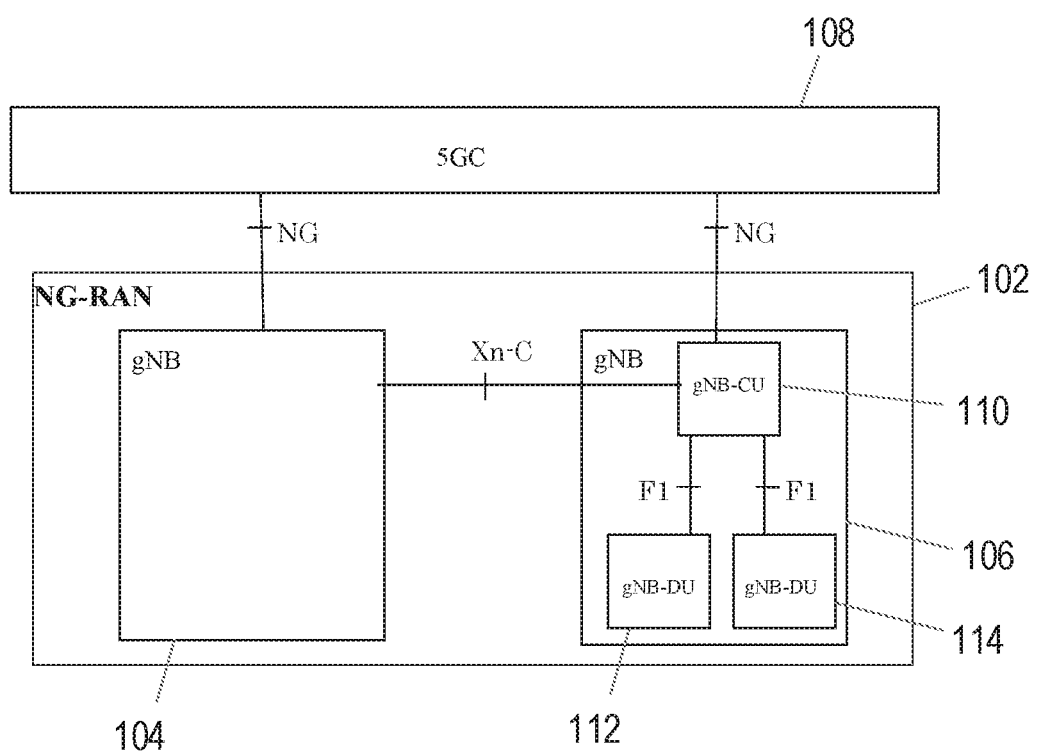
FIG. 1 illustrates a part of a communications network in accordance with an aspect of the disclosure.

FIG. 1 shows the 5G Radio Access Network (RAN) architecture as described in 3GPP TS 38.401 V15.0.0. This document describes the architecture as follows:

The Next Generation Radio Access Network (NG-RAN) 102 consists of a set of radio base stations or gNBs 104, 106 connected to the 5G Core Network (5GC) 108 through the NG logical interface.

A gNB can support FDD mode, TDD mode or dual mode operation.

gNBs can be interconnected through the Xn logical interface.

A gNB such as the gNB 106 may consist of a Central Unit (gNB-CU) 110 and Distributed Units (gNB-DUs) 112, 114.

A gNB-CU and a gNB-DU are connected via a F1 logical interface.

One gNB-DU is connected to only one gNB-CU.

NG, Xn and F1 are logical interfaces. For NG-RAN, the NG and Xn-C interfaces for a gNB consisting of a gNB-CU and gNB-DUs, terminate in the gNB-CU. For EN-DC (which is a dual connectivity mode where a Long Term Evolution (LTE) node is the master and a New Radio (NR) node is the secondary, and is described in more detail below), the S1-U and X2-C interfaces for a gNB consisting of a gNB-CU and gNB-DUs, terminate in the gNB-CU. The gNB-CU and connected gNB-DUs are only visible to other gNBs and the 5GC as a gNB.

The NG-RAN is layered into a Radio Network Layer (RNL) and a Transport Network Layer (TNL). The NG-RAN architecture, i.e. the NG-RAN logical nodes and interfaces between them, is defined as part of the RNL. For each NG-RAN interface (NG, Xn, F1) the related TNL protocol and the functionality are specified. The TNL provides services for user plane transport and signalling transport. In NG-Flex configuration, each gNB is connected to all Access and Mobility Management Functions (AMFs) within an AMF Region. The AMF Region is defined in 3GPP TS 23.501.

The general principles for the specification of the F1 interface are as follows:
 the F1 interface is open;
 the F1 interface supports the exchange of signalling information between the endpoints, in addition the interface shall support data transmission to the respective endpoints;
 from a logical standpoint, the F1 is a point-to-point interface between the endpoints (a point-to-point logical interface should be feasible even in the absence of a physical direct connection between the endpoints);
 the F1 interface supports control plane and user plane separation;
 the F1 interface separates Radio Network Layer and Transport Network Layer;
 the F1 interface enable exchanges of UE associated information and non-UE associated information;
 the F1 interface is defined to be future proof to fulfil different new requirements, support new services and new functions;
 one gNB-CU and set of gNB-DUs are visible to other logical nodes as a gNB, and the gNB terminates X2, Xn, NG and S1-U interfaces;
 the CU may be separated in control plane (CP) and user plane (UP).

The F1-AP is specified in TS 38.473.

The LTE Radio Access Network, or Evolved Universal Terrestrial Radio Access Network (E-UTRAN) supports Dual Connectivity (DC) operation, whereby a multiple Rx/Tx UE in RRC_CONNECTED is configured to utilize radio resources provided by two distinct schedulers, located in two eNBs (radio base stations) connected via a non-ideal backhaul over the X2 interface (see 3GPP 36.300). "Non-ideal backhaul" implies that the transport of messages over the X2 interface between the nodes may be subject to both packet delays and losses.

eNBs involved in DC for a certain UE may assume two different roles: an eNB may either act as an MN (Master node), also referred to as Master eNB (MeNB) or as an SN (Secondary node), also referred to as Secondary eNB. (SeNB). In DC a UE is connected to one MN and one SN. Thus, an eNB can act both as an MN and an SN at the same time, for different UEs.

In LTE DC, only the MeNB has RRC connection with UE, and therefore only the MeNB can send RRC signaling toward the UE. For mobility measurement, the MeNB configures the UE which frequency to measure and how to report etc. Correspondingly, the UE sends measurement results to the MeNB once a criterion is met.

According to LTE principles, when a UE needs to send a measurement report, whether event triggered or due to a periodic trigger, the UE should always send measurement results of the serving cell to network. For a UE in LTE-DC, the serving cell means both cells in a Master Cell Group (MCG) or MN and cells in a Secondary Cell Group (SCG) or SN.

In LTE, only inter-frequency DC is supported (i.e. the MCG and SCG should operate in different carrier frequencies).

LTE-NR Tight Interworking

In 3GPP, a study item on a new radio interface for 5G has recently been completed and 3GPP has now continued with the effort to standardize this new radio interface, often abbreviated to NR (New Radio). LTE-NR DC (also referred to as LTE-NR tight interworking or EN-DC) is currently being defined for Release 15 of the 3GPP specifications.

In this context, the major changes from LTE DC described above are

The introduction of split bearer from the SN (known as SCG split bearer). The SN in this particular case is also referred to as SgNB (secondary gNB, where gNB denotes the NR base station)

The introduction of split bearer for RRC (known as split SRB)

The introduction of a direct RRC from the SN (known as SCG SRB or direct SRB or SRB3).

Figure 2:
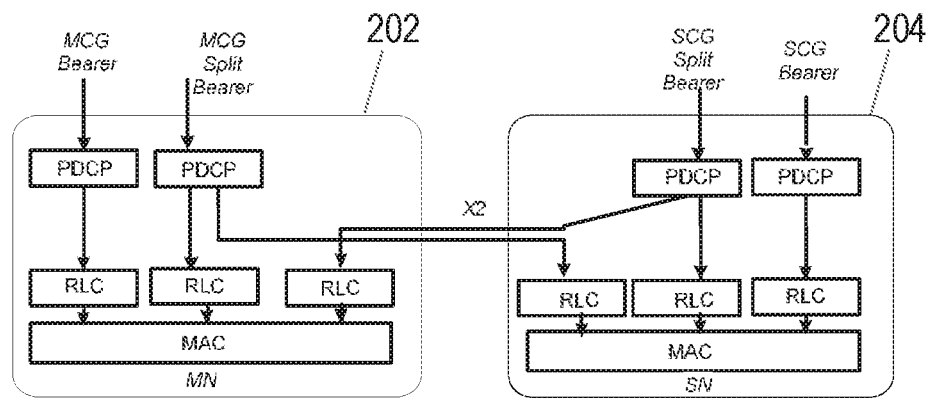
FIG. 2 illustrates a further part of a communications network in accordance with an aspect of the disclosure.
Figure 3:
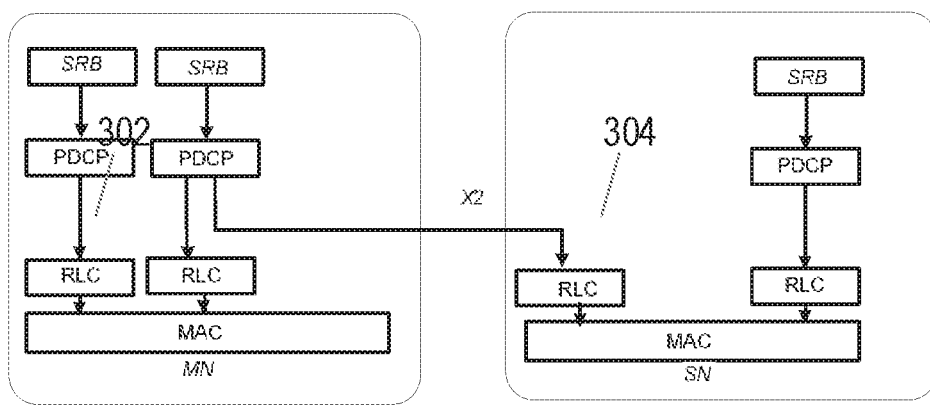
FIG. 3 illustrates a further part of a communications network in accordance with an aspect of the disclosure.

FIGS. 2 and 3 show the User Plane (UP) and Control Plane (CP) architectures for NR dual connectivity and LTE-NR tight interworking.

Specifically, FIG. 2 shows tight interworking in the User Plane in LTE-NR.

FIG. 2 shows a Master node (MN) 202 and a Secondary node (SN) 204, where each node has a Medium Access Control (MAC) layer, Radio Link Control (RLC) layer and Packet Data Convergence Protocol (PDCP) layer, with an X2 interface connecting the MN 202 and the SN 204.

FIG. 3 illustrates split bearers for the control plane in 5G.

Similarly to FIG. 2, FIG. 3 shows a Master node (MN) 302 and a Secondary node (SN) 304, where each node has a Medium Access Control (MAC) layer, Radio Link Control (RLC) layer and Packet Data Convergence Protocol (PDCP) layer, with an X2 interface connecting the MN 302 and the SN 304. From FIG. 3, it can be seen that separate Signaling Radio Bearers (SRBs) are supported both from the MN 302 and the SN 304. This means that a UE can receive signaling messages, i.e. RRC messages (Radio Resource Control messages) both from the MN and the SN. There will thus be two RRC instances responsible for controlling the UE, one directed from the MN and another from the SN in the depicted scenario. The consequence of this architecture is that the UE needs to terminate RRC signaling from two instances, namely the MN and the SN. The motivation for introducing such multiple RRC instances in NR DC, and in particular for LTE-NR DC, is that the MN and SN will partly be autonomously responsible for the control of radio resources.

For example, the MN is allocating resources from some spectrum using LTE, while the SN will be responsible for configuring and allocating resources from some other spectrum that uses NR. As challenges for allocating resources in LTE and NR may differ substantially (e.g. since NR might be allocated in a spectrum where beam-forming is highly desirable, while LTE might be allocated in a spectrum with good coverage but with very congested resources), it is important that the SN has some level of autonomy to configure and manage the UE on resources associated with the SN. On the other hand, the overall responsibility for connectivity to the UE will likely be at MN node, so the MN node has the overall responsibility e.g. for mobility, state changes of the UE, for meeting quality of service demands of the UE, etc.

The MN and SN may be nodes that use LTE (4G) or NR (5G) radio access technologies. They may both support the same technology, or they may support different technologies.

In the current work in 3GPP, the first step is to support the scenario where the MN uses LTE, connected to the Evolved Packet Core (EPC) and the SN uses NR. In this first step, the NR node (SN in this scenario) is not connected directly to the core network, but all traffic to and from the UE is carried via the MN from/to the EPC. This scenario is also known as non-stand-alone NR. After the completion of this alternative, 3GPP will then likely continue with standardization efforts that encompass other scenarios, such as when the NR node (also called gNB, i.e. a base-station supporting NR radio) is connected to the Next Generation Core and acts as an MN. The dual connectivity for NR includes many scenarios, such as 1. The MN supports LTE and SN supports NR discussed above (also called NR "non-stand-alone");
2. The MN supports NR and the SN supports LTE;
3. Both MN and SN are NR.

From a UE perspective, both the cells it operates in LTE and the cells it operates in NR are its serving cell.

To summarize, the Control plane architecture for LTE DC and EN-DC are depicted in FIG. 4.

Specifically, FIG. 4(a) shows the Control plane architecture for Dual Connectivity in LTE DC, where a Master node 402 using LTE and a Secondary node 404 also using LTE are both connected to a UE 406.

FIG. 4(b) shows the Control plane architecture for Dual Connectivity in EN-DC, where a Master node 422 using LTE and a Secondary node 424 using NR are both connected to a UE 426.

The following terminologies are used throughout this text to differentiate different dual connectivity scenarios:

DC: LTE DC (i.e. both MN and SN employ LTE);

EN-DC: LTE-NR dual connectivity where LTE is the master and NR is the secondary;

NE-DC: LTE-NR dual connectivity where NR is the master and LTE is the secondary;

NR-DC (or NR-NR DC): both MN and SN employ NR;

MR-DC (multi-RAT DC): a generic term to describe where the MN and SN employ different RATs (EN-DC is one example of MR-DC).

Several secondary node amendment procedures exist.

One example is a Secondary Node Addition procedure, in which the MN decides to request the SN to allocate radio resources for a specific E-UTRAN Radio Access Bearer (E-RAB). If the RRM entity in the SN is able to admit the resource request, it provides the new SCG radio resource configuration to the MN in a NR RRC configuration message contained in the SgNB Addition Request Acknowledge message.

Another example is a Secondary Node Modification procedure, which may be initiated either by the MN or by the SN. If initiated by the MN, the MN sends the SgNB Modification Request message, and the SN responds with the SgNB Modification Request Acknowledge message, which may contain SCG radio resource configuration information within a NR RRC configuration message and data forwarding address information (if applicable). If initiated by the SN, the SN sends the SgNB Modification Required message including a NR RRC configuration message, which may contain bearer context related, other UE context related information and the new SCG radio resource configuration.

In each of these secondary node amendment procedures, the SN informs the MN when it configures measurements. This can be in an Information Element (IE) included in one of the following messages:

1. SgNB addition request acknowledge, or
2. SgNB modification request acknowledge, or
3. SgNB modification required.

The first two messages are defined as response messages in class-1 procedures. Therefore, the MN does not provide any reply. However, the MN after receiving a positive response from the UE, will send the following message to the SN:

SgNB reconfiguration complete (after the MN has received the RRC complete message from the UE, in the procedures initiated by the MN).

The third message is part of a class-1 procedure according to which the MN provides to the SN the following response message:

SgNB modification confirm (after the MN has received the RRC complete message from the UE, in the procedure initiated by the SN).

However, the gap information is provided to the SN as part of an IE that is included in one of the following messages:

1. SgNB addition request, or
2. SgNB modification request.

The implication of this description above is that, in order for the MN to indicate the measurement gaps to the SN, it has to initiate a (probably dummy) SgNB modification request procedure as neither the SgNB reconfiguration complete or the SgNB modification confirm messages can be utilized to indicate the gaps. The problem with this is that, from the moment the UE has received the measurement configuration, the UE will apply the measurement gap configurations, while the SN has to wait for the rest of the procedures to finish and then receive a dummy SgNB modification request message that includes the gap configuration before it becomes aware of the new/updated gap information. This means that, during this time period, as the SN is not aware of the gap configured by the MN and applied by the UE, it might end up sending data to the UE while the UE's gap is on and UE is performing measurements and not listening to the transmission of the SN.

Certain aspects of the present disclosure and their embodiments may provide solutions to these or other challenges.

Several secondary node amendment procedures exist, and example embodiments will be described with reference to those procedures.

EN-DC Procedures

Secondary Node Addition The Secondary Node Addition procedure is initiated by the MN and is used to establish a UE context at the SN to provide radio resources from the SN to the UE. For bearers requiring SCG radio resources, this procedure is used to add at least the first cell of the SCG. This procedure can also be used to configure an SN terminated MCG bearer (where no SCG configuration is needed).

Figure 5:
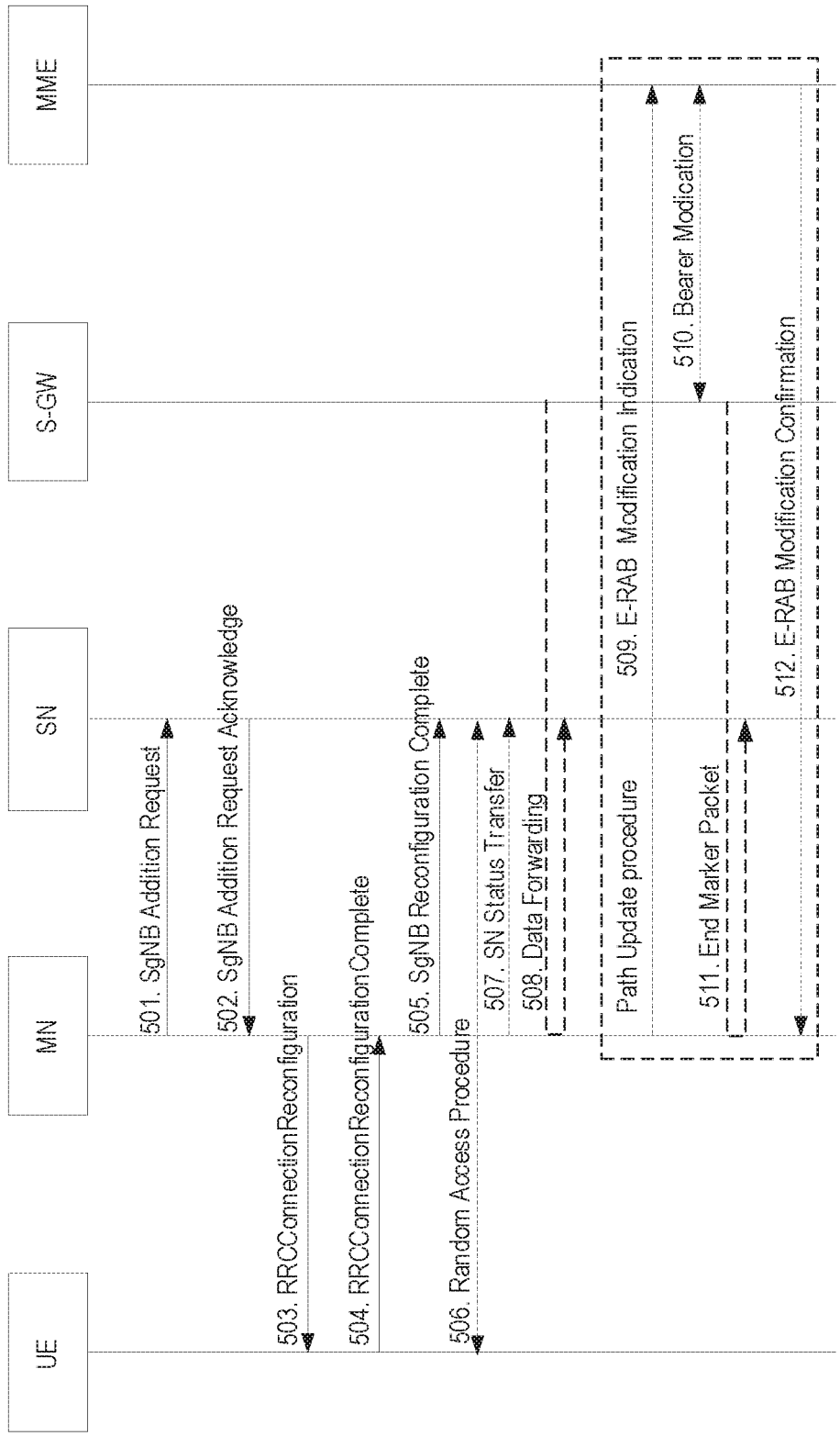
FIG. 5 is a signalling diagram illustrating a first procedure in accordance with an aspect of the disclosure.

FIG. 5 shows the Secondary Node Addition procedure.

In step 501, the MN decides to request the SN to allocate radio resources for a specific E-UTRAN Radio Access Bearer (E-RAB), indicating E-RAB characteristics (E-RAB parameters, TNL address information corresponding to bearer type). In addition, for bearers requiring SCG radio resources, MN indicates the requested SCG configuration information, including the entire UE capabilities and the UE capability coordination result. In this case, the MN also provides the latest measurement results for SN to choose and configure the SCG cell(s). The MN may request the SN to allocate radio resources for split SRB operation. The MN always provides all the needed security information to the SN (even if no SN terminated bearers are setup) to enable SRB3 to be setup based on SN decision. In case of bearer options that require X2-U resources between the MN and the SN, the MN provides X2-U TNL address information for the respective E-RAB, X2-U DL TNL address information for SN terminated bearers, X2-U UL TNL address information for MN terminated bearers. In case of SN terminated split bearers the MN provides the maximum QoS level that it can support. The SN may reject the request.

For split bearers, MCG and SCG resources may be requested of such an amount, that the QoS for the respective E-RAB is guaranteed by the exact sum of resources provided by the MCG and the SCG together, or even more. For MN terminated split bearers, the MNs decision is reflected in 501 by the E-RAB parameters signalled to the SN, which may differ from E-RAB parameters received over S1.

For a specific E-RAB, the MN may request the direct establishment of an SCG or a split bearer, i.e., without first having to establish an MCG bearer. It is also allowed that all E-RABs can be configured as SN terminated bearers, i.e. there is no E-RAB established as an MN terminated bearer.

In step 502, if the RRM entity in the SN is able to admit the resource request, it allocates respective radio resources and, dependent on the bearer option, respective transport network resources. For bearers requiring SCG radio resources, the SN triggers Random Access so that synchronisation of the SN radio resource configuration can be performed. The SN decides the Pscell and other SCG Scells and provides the new SCG radio resource configuration to the MN in a NR RRC configuration message contained in the SgNB Addition Request Acknowledge message. In case of bearer options that require X2-U resources between the MN and the SN, the SN provides X2-U TNL address information for the respective E-RAB, X2-U UL TNL address information for SN terminated bearers, X2-U DL TNL address information for MN terminated bearers. For SN terminated bearers, the SN provides the S1-U DL TNL address information for the respective E-RAB and security algorithm. If SCG radio resources have been requested, the SCG radio resource configuration is provided.

For the SN terminated split bearer option, the SN may either decide to request resources from the MN of such an amount, that the QoS for the respective E-RAB is guaranteed by the exact sum of resources provided by the MN and the SN together, or even more. The SNs decision is reflected in 502 by the E-RAB parameters signalled to the MN, which may differ from E-RAB parameters received in 501. The QoS level requested from the MN shall not exceed the level that the MN offered when setting up the split bearer in 501.

In case of MN terminated bearers, transmission of user plane data may take place after step 502.

In case of SN terminated bearers, data forwarding and the SN Status Transfer may take place after step 502.

In step 503, the MN sends to the UE the RRCConnectionReconfiguration message including the NR RRC configuration message, without modifying it.

In step 504, the UE applies the new configuration and replies to MN with RRCConnectionReconfigurationComplete message, including a NR RRC response message. In case the UE is unable to comply with (part of) the configuration included in the RRCConnectionReconfiguration message, it performs the reconfiguration failure procedure.

In step 505, the MN informs the SN that the UE has completed the reconfiguration procedure successfully via SgNB ReconfigurationComplete message, including the encoded NR RRC response message.

In step 506, if configured with bearers requiring SCG radio resources, the UE performs synchronisation towards the PSCell of the SN. The order the UE sends the RRCConnectionReconfigurationComplete message and performs the Random Access procedure towards the SCG is not defined. The successful RA procedure towards the SCG is not required for a successful completion of the RRC Connection Reconfiguration procedure.

In steps 507 and 508, in the case of SN terminated bearers, and dependent on the bearer characteristics of the respective E-RAB, the MN may take actions to minimise service interruption due to activation of EN-DC (Data forwarding, SN Status Transfer).

In steps 509-512, for SN terminated bearers, the update of the UP path towards the EPC is performed.

The (simplified) structure of the X2 messages, sgNB addition request, sgNB addition request ack and sgNB reconfiguration complete messages are shown below (details can be found in TS 36.423)

SGNB Addition Request

| IE/Group Name | Presence | Range | Semantics description |
| --- | --- | --- | --- |
| Message Type | M | | |
| MeNB UE X2AP ID | M | | Allocated at the MeNB |
| NR UE Security Capabilities | M | | |
| SgNB Security Key | M | | The S-KgNB which is provided by the MeNB, see TS 33.401 [18]. |
| SgNB UE Aggregate Maximum Bit Rate | M | | The UE Aggregate Maximum Bit Rate is split into MeNB UE Aggregate Maximum Bit Rate and SgNB UE Aggregate Maximum Bit Rate which are enforced by MeNB and en-gNB respectively. |
| Serving PLMN | O | | The serving PLMN of the SCG in the en-gNB. |
| Handover Restriction List | O | | |
| E-RABs To Be Added List | | 1 | |
| MeNB to SgNB Container | M | | Includes the SCG-ConfigInfo message as defined in TS 38.331 [31]. |
| SgNB UE X2AP ID | O | | Allocated at the en-gNB. |
| Expected UE Behaviour | O | | |
| MeNB UE X2AP ID Extension | O | | Allocated at the MeNB. |
| Requested MCG split SRBs | O | | Indicates that resources for MCG Split SRB are requested. |
| MeNB Resource Coordination Information | O | | Information used to coordinate resources utilisation between MeNB and en-gNB. |

SGNB Addition Request Acknowledge

| IE/Group Name | Presence | Range | Semantics description |
| --- | --- | --- | --- |
| Message Type | M | | |
| MeNB UE X2AP ID | M | | Allocated at the MeNB. |
| SgNB UE X2AP ID | M | | Allocated at the en-gNB. |
| E-RABs Admitted To Be Added List | | 1 | |
| E-RABs Not Admitted List | O | | A value for E-RAB ID shall only be present once in E-RABs Admitted List IE and in E-RABs Not Admitted List IE. |
| SgNB to MeNB Container | M | | Includes the SCG-Config message as defined in TS 38.331[31]. |
| Criticality Diagnostics | O | | |
| GW Transport Layer Address | O | | Indicating GW Transport Layer Address. |
| MeNB UE X2AP ID Extension | O | | Allocated at the MeNB |
| Tunnel Information for BBF | O | | Indicating eNB's Local IP Address assigned by the broadband access provider, UDP port Number. |
| Admitted MCG split SRBs | O | | Indicates admitted SRBs |
| SgNB Resource Coordination Information | O | | Information used to coordinate resources utilisation between en-gNB and MeNB. |

In one embodiment, the sgNB reconfiguration complete message is enhanced to include the gap configuration information. The updated message is shown below SGNB Reconfiguration Complete

| IE/Group Name | Presence | Range | Semantics description |
| --- | --- | --- | --- |
| Message Type | M | | |
| MeNB UE X2AP ID | M | | Allocated at the MeNB. |
| SgNB UE X2AP ID | M | | Allocated at the en-gNB. |
| Response Information | M | | |
| >CHOICE Response Type | M | | |
| >>Configuration successfully applied | | | |

| IE/Group Name | Presence | Range | Semantics description |
| --- | --- | --- | --- |
| >>>MeNB to SgNB Container1 | M | | Includes the NR RRCReconfigurationComplete message as defined in TS 38.331 [31]. |
| MeNB to SgNB Container2 | O | | Includes the SCG-ConfigInfo message as defined in TS 38.331 [31]. |
| >>Configuration rejected | | | |
| >>>Cause | M | | |
| MeNB UE X2AP ID Extension | O | | Allocated at the MeNB |

Thus, compared with the previous SGNB RECONFIGURATION COMPLETE message, the SCG-ConfigInfo message as defined in TS 38.331 is added.

Secondary Node Modification

The Secondary Node Modification procedure may be initiated either by the MN or by the SN and be used to modify, establish or release bearer contexts, to transfer bearer contexts to and from the SN or to modify other properties of the UE context within the same SN. It may also be used to transfer an NR RRC message from the SN to the UE via the MN and the response from the UE via MN to the SN (e.g. when SRB3 is not used).

The Secondary Node modification procedure does not necessarily need to involve signalling towards the UE.

Figure 6:
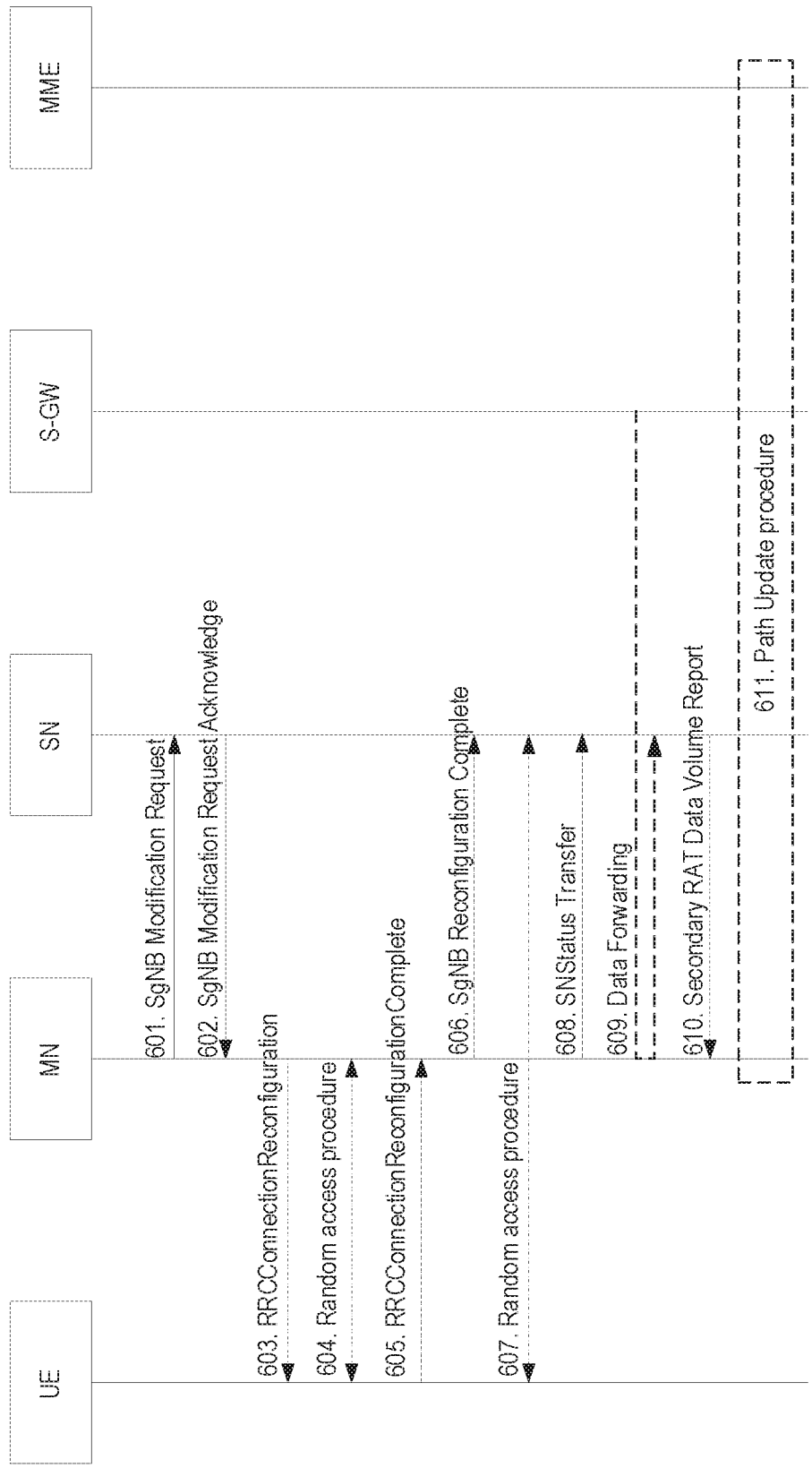
FIG. 6 is a signalling diagram illustrating a second procedure in accordance with an aspect of the disclosure.

FIG. 6 illustrates an example signalling flow for a MN initiated SN Modification procedure. The MN uses the procedure to initiate configuration changes of the SCG within the same SN, e.g. the addition, modification or release of SCG bearer(s) and the SCG RLC bearer of split bearer(s), as well as configuration changes for SN terminated MCG bearers. Bearer type change may result in adding the new bearer configuration and releasing the old bearer configuration within a single MN initiated SN Modification procedure for the respective E-RAB. The MN uses this procedure to perform handover within the same MN while keeping the SN. The MN also uses the procedure to query the current SCG configuration, e.g. when delta configuration is applied in a MN initiated SN change. MN may not use the procedure to initiate the addition, modification or release of SCG Scells. The SN may reject the request, except if it concerns the release of SN terminated bearer(s) or the SCG RLC bearer of MN terminated bearer(s), or if it is used to perform handover within the same MN while keeping the SN.

In step 601, the MN sends the SgNB Modification Request message, which may contain bearer context related or other UE context related information, data forwarding address information (if applicable) and the requested SCG configuration information, including the UE capability coordination result to be used as basis for the reconfiguration by the SN. In case a security key update in the SN is required, the PDCP Change Indication indicates that a S-K$_{gNB}$ update is required and a new SgNB Security Key is included. In case of SCG RLC re-establishment for E-RABs configured with an MN terminated bearer with an SCG RLC bearer for which no bearer type change is performed, the MN provides a new Uplink (UL) GPRS Tunneling Protocol (GTP) Tunnel Endpoint IDentifier (TEID) to the SN. The SN shall continue sending UL PDCP PDUs to the MN with the previous UL GTP TEID until it re-establishes the RLC and use the new UL GTP TEID after re-establishment. In case of PDCP re-establishment for E-RABs configured with an SN terminated bearer with an MCG RLC bearer for which no bearer type change is performed, the MN provides a new DL GTP TEID to the SN. The SN shall continue sending DL PDCP PDUs to the MN with the previous DL GTP TEID until it performs PDCP re-establishment and use the new DL GTP TEID starting with the PDCP re-establishment.

In step 602, the SN responds with the SgNB Modification Request Acknowledge message, which may contain SCG radio resource configuration information within a NR RRC configuration message and data forwarding address information (if applicable). In case of a PSCell change with security key update, for E-RABs configured with the MN terminated bearer option that require X2-U resources between the MN and the SN, for which no bearer type change is performed, the SN provides a new Downlink (DL) GTP TEID to the MN. The MN shall continue sending DL PDCP PDUs to the SN with the previous DL GTP TEID until it performs PDCP re-establishment or PDCP data recovery, and use the new DL GTP TEID starting with the PDCP re-establishment or data recovery. In case of a PSCell change with security key update, for E-RABs configured with the SN terminated bearer option that require X2-U resources between the MN and the SN, for which no bearer type change is performed, the SN provides a new UL GTP TEID to the MN. The MN shall continue sending UL PDCP PDUs to the SN with the previous UL GTP TEID until it re-establishes the RLC and use the new UL GTP TEID after re-establishment.

In steps 603-605, the MN initiates the RRC connection reconfiguration procedure, including the NR RRC configuration message. The UE applies the new configuration, synchronizes to the MN (if instructed, in case of intra-MN handover) and replies with RRCConnectionReconfigurationComplete, including a NR RRC response message. In case the UE is unable to comply with (part of) the configuration included in the RRCConnectionReconfiguration message, it performs the reconfiguration failure procedure.

In step 606, upon successful completion of the reconfiguration, the success of the procedure is indicated in the SgNB Reconfiguration Complete message.

In step 607, if instructed, the UE performs synchronisation towards the PSCell of the SN as described in SgNB addition procedure. Otherwise, the UE may perform UL transmission after having applied the new configuration.

In steps 608 and 609, if applicable, data forwarding between MN and the SN takes place.

In step 610, the SN sends the Secondary RAT Data Volume Report message to the MN and includes the data volumes delivered to the UE over the NR radio for the E-RABs to be released.

The order the SN sends the Secondary RAT Data Volume Report message and performs data forwarding with MN is not defined. The SN may send the report when the transmission of the related bearer is stopped.

In step 611, if applicable, a path update is performed.

In one embodiment, the sgNB reconfiguration complete message is enhanced to include the gap configuration information. The updated message is shown below SGNB Reconfiguration Complete

| IE/Group Name | Presence | Range | Semantics description |
|---|---|---|---|
| Message Type | M | | |
| MeNB UE X2AP ID | M | | Allocated at the MeNB. |
| SgNB UE X2AP ID | M | | Allocated at the en-gNB. |
| Response Information | M | | |
| >CHOICE Response Type | M | | |
| >>Configuration successfully applied | | | |
| >>>MeNB to SgNB Container1 | M | | Includes the NR RRCReconfigurationComplete message as defined in TS 38.331 [31]. |
| MeNB to SgNB Container2 | O | | Includes the SCG-ConfigInfo message as defined in TS 38.331 [31]. |
| >>Configuration rejected | | | |
| >>>Cause | M | | |
| MeNB UE X2AP ID Extension | O | | Allocated at the MeNB |

Thus, compared with the previous SGNB RECONFIGURATION COMPLETE message, the SCG-ConfigInfo message as defined in TS 38.331, is added.

Figure 7:
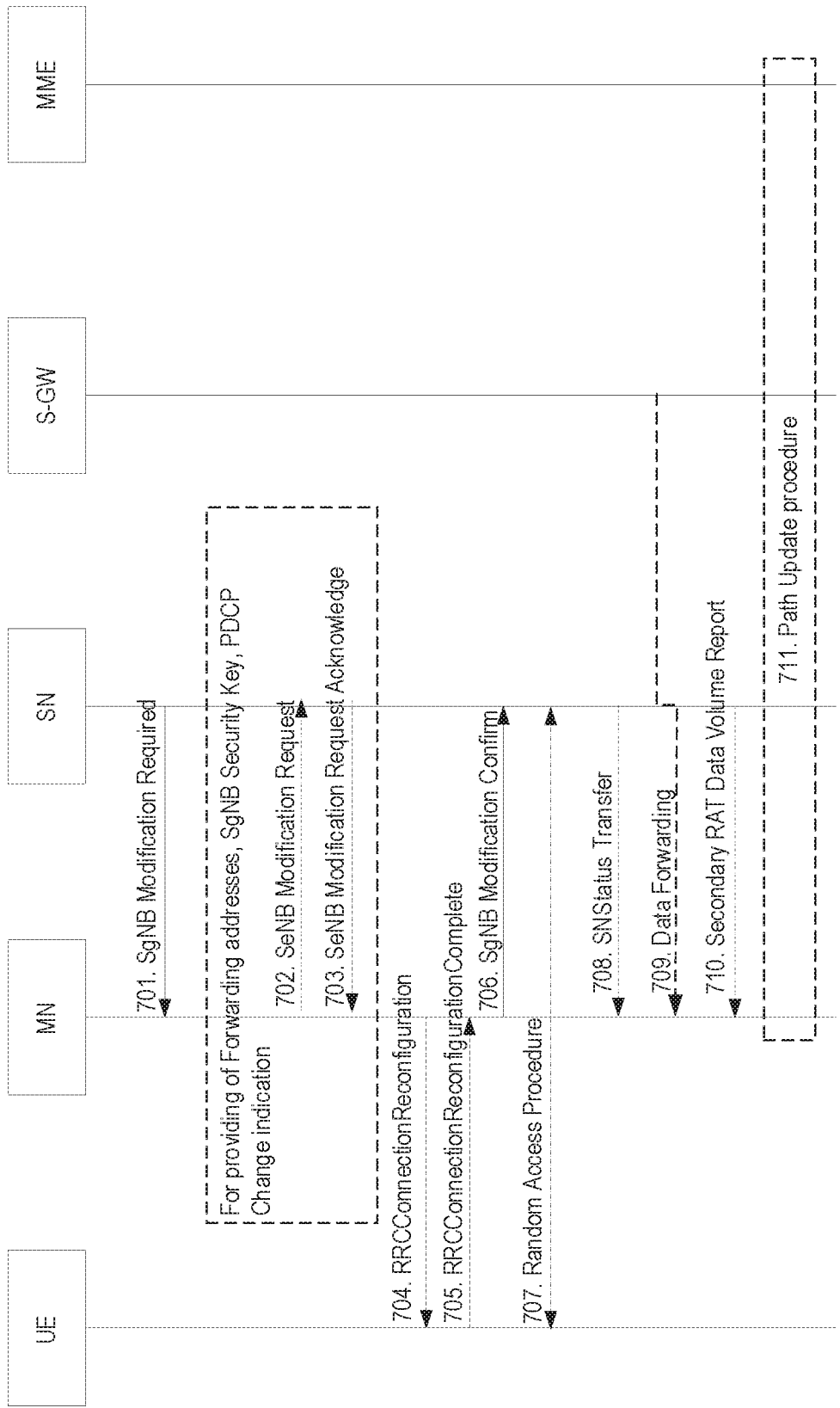
FIG. 7 is a signalling diagram illustrating a third procedure in accordance with an aspect of the disclosure.

FIG. 7 illustrates an example signalling flow for an SN initiated SgNB Modification procedure, with MN involvement.

The SN uses the procedure to perform configuration changes of the SCG within the same SN, e.g. to trigger the release of SCG bearer(s) and the SCG RLC bearer of split bearer(s) (upon which the MN may release the bearer or reconfigure it to an MCG bearer, either MN terminated or SN terminated), and to trigger PSCell change (e.g. when a new security key is required or when the MN needs to perform PDCP data recovery). The MN cannot reject the release request of SCG bearer and the SCG RLC bearer of a split bearer.

In step 701, the SN sends the SgNB Modification Required message including a NR RRC configuration message, which may contain bearer context related, other UE context related information and the new SCG radio resource configuration. For bearer release or modification a corresponding E-RAB list is included in the SgNB Modification Required message. In case of change of security key, the PDCP Change Indication indicates that a S-$K_{gNB}$ update is required. In case the MN needs to perform PDCP data recovery, the PDCP Change Indication indicates that PDCP data recovery is required.

The SN can decide whether the change of security key is required.

In steps 702 and 703, if data forwarding and/or SN security key change needs to be applied, the MN triggers the preparation of the MN initiated SN Modification procedure and provides forwarding address and/or a new SN security key information within the SgNB Modification Request message, respectively. If the SN requested to release a bearer in step 701, and the MN decides to reconfigure it to an MCG bearer, the MN also triggers the preparation of the MN initiated SN Modification procedure and the SN provides respective RRC information within the SgNB Modification Request Acknowledgement message.

If only SN security key (i.e. without PDCP Change Indication) is provided in step 702, the MN does not need to wait for the reception of step 703 to initiate the RRC connection reconfiguration procedure.

In step 704, the MN sends the RRCConnectionReconfiguration message including a NR RRC configuration message to the UE including the new SCG radio resource configuration.

In step 705, the UE applies the new configuration and sends the RRCConnectionReconfigurationComplete message, including an encoded NR RRC response message. In case the UE is unable to comply with (part of) the configuration included in the RRCConnectionReconfiguration message, it performs the reconfiguration failure procedure.

In step 706, upon successful completion of the reconfiguration, the success of the procedure is indicated in the SgNB Modification Confirm message containing the encoded NR RRC response message.

In step 707, if instructed, the UE performs synchronisation towards the PSCell of the SN as described in SN addition procedure. Otherwise, the UE may perform UL transmission after having applied the new configuration.

In steps 708 and 709, if applicable, data forwarding between MN and the SN takes place.

In step 710, the SN sends the Secondary RAT Data Volume Report message to the MN and includes the data volumes delivered to the UE over the NR radio for the E-RABs to be released.

The order the SN sends the Secondary RAT Data Volume Report message and performs data forwarding with MN is not defined. The SN may send the report when the transmission of the related bearer is stopped.

In step 711, if applicable, a path update is performed.

Figure 8:
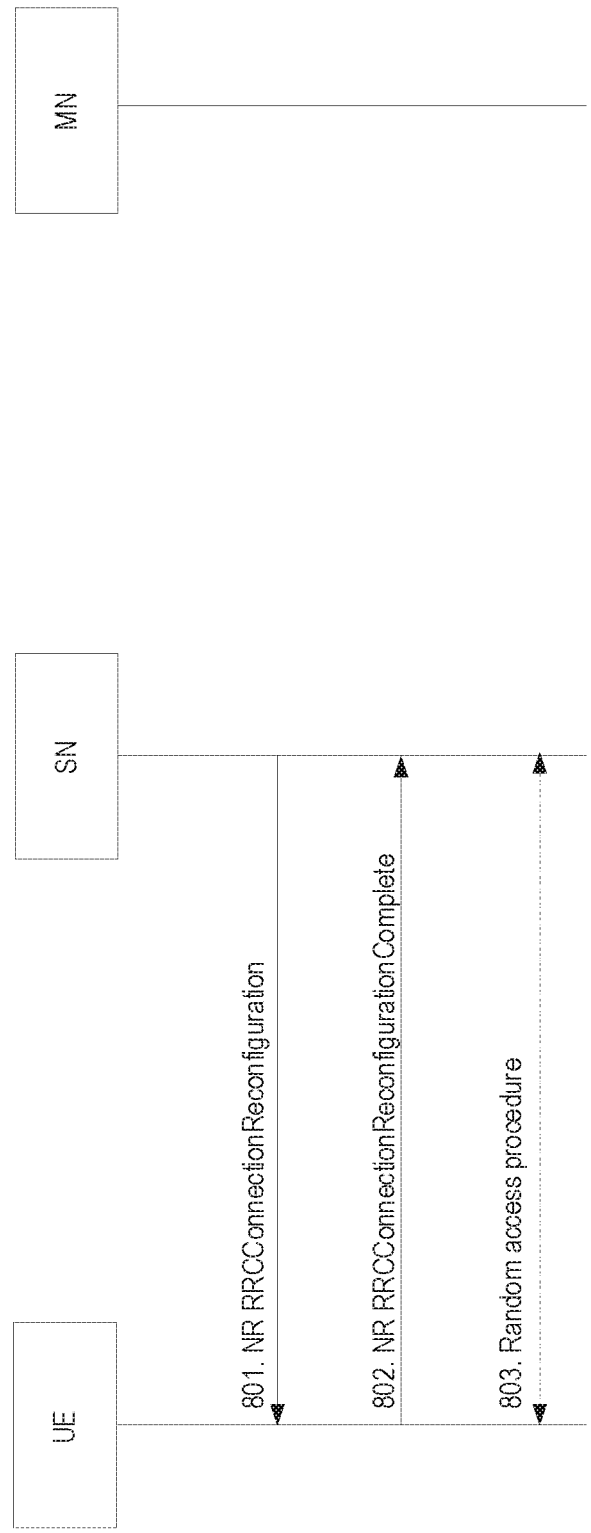
FIG. 8 is a signalling diagram illustrating a fourth procedure in accordance with an aspect of the disclosure.

FIG. 8 shows an example signalling flow for an SN initiated SN modification procedure, without MN involvement. The SN can decide whether the Random Access procedure is required.

The SN initiated modification without MN involved procedure is used to modify the configuration within SN in case no coordination with MN is required, including the addition/modification/release of SCG Scell and PSCell change (e.g. when the security key does not need to be changed and the MN does not need to be involved in PDCP recovery).

In step 801, the SN sends the RRCConnectionReconfiguration message to the UE through SRB3.

In step 802, the UE applies the new configuration and replies with the RRCConnectionReconfigurationComplete message. In case the UE is unable to comply with (part of) the configuration included in the RRCConnectionReconfiguration message, it performs the reconfiguration failure procedure.

In step 803, if instructed, the UE performs synchronisation towards the PSCell of the SN as described in SgNB Addition procedure. Otherwise the UE may perform UL transmission after having applied the new configuration.

The (simplified) structure of the X2 messages sgNB modification request, sgNB modification request ack, sgnB modification required and sgNB modification confirm, as described with reference to FIG. 7, are shown below (further details can be found in TS 36.423)

SGNB Modification Request

| IE/Group Name | Presence | Range | Semantics description |
|---|---|---|---|
| Message Type | M | | |
| MeNB UE X2AP ID | M | | Allocated at the MeNB. |

-continued

| IE/Group Name | Presence | Range | Semantics description |
|---|---|---|---|
| SgNB UE X2AP ID | M | | Allocated at the en-gNB. |
| Cause | M | | |
| PDCP Change Indication | O | | |
| Serving PLMN | O | | The serving PLMN of the SCG in the en-gNB. |
| Handover Restriction List | O | | |
| SCG Configuration Query | O | | |
| UE Context Information | | 0 . . . 1 | |
| >NR UE Security Capabilities | O | | |
| >SgNB Security Key | O | | |
| >SgNB UE Aggregate Maximum Bit Rate | O | | |
| >E-RABs To Be Added List | | 0 . . . 1 | |
| >E-RABs To Be Modified List | | 0 . . . 1 | |
| >E-RABs To Be Released List | | 0 . . . 1 | |
| MeNB to SgNB Container | O | | Includes the SCG-ConfigInfo message as defined in TS 38.331 [31]. |
| MeNB UE X2AP ID Extension | O | | Allocated at the MeNB |
| MeNB Resource Coordination Information | O | | Information used to coordinate resources utilisation between MeNB and en-gNB. |

SGNB Modification Request Acknowledge

| IE/Group Name | Presence | Range | Semantics description |
|---|---|---|---|
| Message Type | M | | |
| MeNB UE X2AP ID | M | | Allocated at the MeNB. |
| SgNB UEX2AP ID | M | | Allocated at the en-gNB. |
| E-RABs Admitted List | | 0 . . . 1 | |
| >E-RABs Admitted To Be Added List | | 1 | |
| >E-RABs Admitted To Be Modified List | | 0 . . . 1 | |
| >E-RABs Admitted To Be Released List | | 0 . . . 1 | |
| E-RABs Not Admitted List | O | | A value for E-RAB ID shall only be present once in E-RABs Admitted List IE and in E-RABs Not Admitted List IE. |
| SgNB to MeNB Container | O | | Includes the NR SCG-Confi message as defined in TS 38.331 [31]. |
| Criticality Diagnostics | O | | |
| MeNB UE X2AP ID Extension | O | | Allocated at the MeNB |
| SgNB Resource Coordination Information | O | | Information used to coordinate resources utilisation between en-gNB and MeNB. |

SGNB Modification Required

| IE/Group Name | Presence | Range | Semantics description |
|---|---|---|---|
| Message Type | M | | |
| MeNB UE X2AP ID | M | | Allocated at the MeNB. |
| SgNB UEX2AP ID | M | | Allocated at the en-gNB. |
| Cause | M | | |
| PDCP Change Indication | O | | |
| E-RABs To Be Released List | | 0 . . . 1 | |
| >E-RABs To Be Released Item | | 1 . . . <maxnoof Bearers> | |
| >>E-RAB ID | M | | |
| >>Cause | M | | |
| SgNB to MeNB Container | O | | Includes the NR SCG-Config message as defined in TS 38.331 [31]. |
| MeNB UE X2AP ID Extension | O | | Allocated at the MeNB |
| E-RABs To Be Modified List | | 0 . . . 1 | |
| SgNB Resource Coordination Information | O | | Information used to coordinate resources utilisation between the en-gNB and the MeNB. |

In one embodiment of this invention, the sgNB modification confirm message is enhanced to include the gap configuration information. The updated message is shown below:

SGNB Modification Confirm

| IE/Group Name | Presence | Range | Semantics description |
|---|---|---|---|
| Message Type | M | | |
| MeNB UE X2AP ID | M | | Allocated at the MeNB. |
| SgNB UE X2AP ID | M | | Allocated at the en-gNB. |
| MeNB to SgNB Container 1 | O | | Includes the NR RRCReconfigurationComplete message as defined in TS 38.331. |
| MeNB to SgNB Container2 | O | | Includes the SCG-ConfigInfo message as defined in TS 38.331. |
| Criticality Diagnostics | O | | |
| MeNB UE X2AP ID Extension | O | | Allocated at the MeNB. |
| MeNB Resource Coordination Information | O | | Information used to coordinate resources utilisation between the MeNB and the en-gNB. |

Thus, compared with the previous SGNB MODIFICATION CONFIRM message, the SCG-ConfigInfo message as defined in TS 38.331, is added.

Measurement Configurations and Inter-Node Messages

The procedure for configuring the UE measurements in EN-DC and in NR stand-alone is described in TS 38.331 and TS 38.133. The network provides to the UE the measurement configuration (MeasConfig) that includes the measurement gaps (MeasGapConfig). The measurement gaps indicate periods of time in which the UE performs measurement. The network should not provide control/data PDUs to the UE during these periods of time. Depending on the UE capabilities, the network may decide to configure (1) a single per-UE gap or (2) independent per-frequency range (FR) gaps. It should be noted that even if the UE supports a per FR gap, the network can still decide to configure the UE with a per UE gap that is applicable to both FR1 and FR2.

As described in TS 38.331, Inter-node messages used to communicate measurement related information between master and secondary nodes in the case of EN-DC or NR-NR DC. Inter-node messages are RRC messages that are sent either across the X2-, Xn- or the NG-interface, between two gNBs (in the case of handover and NR dual connectivity, for standalone NR), or between an eNB and a gNB (in the case of EN-DC for non-standalone NR or inter-RAT handover between LTE and NR). We describe here only CG-Config and CG-ConfgInfo which are relevant for this discosure (i.e. measurement configurations).

CG-Config

This message is used to transfer the SCG radio configuration as generated by the SgNB. The message is sent from a secondary gNB to a master eNB in the case of EN-DC; and from a secondary gNB to a master gNB in the case of NR-NR DC (however, it should be noted that the NR-NR DC case is still under discussion in 3GPP and thus a different message could be used). The ASN.1 structure of the message is shown below (some non-relevant parts not shown, please refer to TS 38.331 for the full content of the message).

```
CG-Config message
CG-Config ::=                         SEQUENCE {
    criticalExtensions                    CHOICE {
        c1                                                CHOICE{
            cg-Config                         CG-Config-IEs,
            spare3 NULL, spare2 NULL, spare1 NULL
        },
        criticalExtensionsFuture              SEQUENCE { }
    }
}
CG-Config-IEs ::=                     SEQUENCE {
    scg-CellGroupConfig           OCTET STRING (CONTAINING RCReconfiguration)
                                                                  OPTIONAL,
    scg-RB-Config                 OCTET STRING (CONTAINING RadioBearerConfig)
                                                                  OPTIONAL,
    configRestrictModReq                  ConfigRestrictModReqSCG  OPTIONAL,
    drx-InfoSCG                           DRX-Info                 OPTIONAL,
    candidateCellInfoListSN       OCTET STRING (CONTAINING CandidateCellInfoList)
                                                                  OPTIONAL,
    measConfigSN                          MeasConfigSN    OPTIONAL,
    selectedBandCombinationNR             BandCombinationIndex OPTIONAL,
    nonCriticalExtension                  SEQUENCE { }        OPTIONAL
}
MeasConfigSN ::= SEQUENCE {
    measuredFrequenciesFR1        SEQUENCE (SIZE (1..maxMeasFreqsMN))
                                                      OF NR-FreqInfo OPTIONAL,
    ...
}
NR-FreqInfo ::= SEQUENCE {
    measuredFrequency             ARFCN-ValueNR           OPTIONAL,
    ...
}
```

The measConfigSN provides the list of NR frequencies that the SN is configuring the UE to measure, as described in TS 38.331. This information will be used by the MN to decide whether a gap is to be configured/updated. Note that even though the name of the IE inside is measured Frequencies FR1, in the case of per UE gap, the SN needs to include also the FR2 frequencies.

CG-ConfigInfo

This message is used by master eNB or gNB to request the SgNB to perform certain actions e.g. to establish, modify or release an SCG. The message may include additional information e.g. to assist the SgNB to set the SCG configuration. It can also be used by a CU to request a DU to perform certain actions, e.g. to establish, modify or release an MCG or SCG.

```
CG-ConfigInfo message
CG-ConfigInfo ::=                     SEQUENCE {
    criticalExtensions                    CHOICE {
        c1                                                CHOICE{
            cg-ConfigInfo                     CG-ConfigInfo-IEs,
            spare3 NULL, spare2 NULL, spare1 NULL
        },
        criticalExtensionsFuture              SEQUENCE { }
    }
}
```

```
CG-ConfigInfo-IEs ::=           SEQUENCE {
    ue-CapabilityInfo           OCTET STRING (CONTAINING UE-CapabilityRAT-
ContainerList)                  OPTIONAL,-- Cond SN-Addition
    candidateCellInfoListMN             CandidateCellInfoList                       OPTIONAL,
    candidateCellInfoListSN             OCTET STRING (CONTAINING
                                                    CandidateCellInfoList)          OPTIONAL,
    measResultCellListSFTD              MeasResultCellListSFTD                      OPTIONAL,
    scgFailureInfo                      SEQUENCE {
        failureType                                 ENUMERATED { t310-Expiry,
                                                                random AccessProblem,
                                                    rlc-MaxNumRetx, scg-ChangeFailure,
                                                                scg-reconfigFailure,
                                                                srb3-IntegrityFailure},
        measResultSCG                               OCTET STRING (CONTAINING
                                                                MeasResultSCG-Failure)
    } OPTIONAL,
    configRestrictInfo                  ConfigRestrictInfoSCG                       OPTIONAL,
    drx-InfoMCG                         DRX-Info                                    OPTIONAL,
    measConfigMN                        MeasConfigMN                                OPTIONAL,
    sourceConfigSCG                     OCTET STRING (CONTAINING
                                                    RRCReconfiguration)             OPTIONAL,
    scg-RB-Config               OCTET STRING (CONTAINING RadioBearerConfig)
                                                                                    OPTIONAL,
    mcg-RB-Config               OCTET STRING (CONTAINING RadioBearerConfig)
                                                                                    OPTIONAL,
    nonCriticalExtension                SEQUENCE { }                                OPTIONAL
}
ConfigRestrictInfoSCG ::=   SEQUENCE {
    allowedBC-ListMRDC   BandCombinationIndexList                   OPTIONAL,
    allowedBPC-ListMRDC  BPC-IndexList                          OPTIONAL,
    powerCoordination-FR1       SEQUENCE {
    p-maxNR                     P-Max                   OPTIONAL,
    p-maxEUTRA                  P-Max                   OPTIONAL
}                                           OPTIONAL,
    servCellIndexRangeSCG       SEQUENCE {
        lowBound        ServCellIndex,
        upBound         ServCellIndex
    }                                       OPTIONAL,
-- Cond SN-Addition
    maxMeasFreqsSCG-NR          INTEGER(1..maxFreqsMN)              OPTIONAL,
    ...
}
MeasConfigMN ::= SEQUENCE {
    measuredFrequenciesMN               SEQUENCE (SIZE (1..maxMeasFreqsMN))
                                                    OF NR-FreqInfo                  OPTIONAL,
    measGapConfigFR1            GapConfig                           OPTIONAL,
    gapPurpose                  ENUMERATED {perUE, perFR1}          OPTIONAL,
    ...
}
```

The maxMeasFreqSCG-NR tells the SN the maximum number of NR frequencies that it can configure the UE to measure.

The measConfigMN provides the list of NR frequencies that the MN is configuring the UE to measure and also a measurement gap configuration. The gap configuration can be just for FR1 frequencies or for both FR1 and FR2 (i.e. per UE), depending on the setting of the gapPurpose IE. The list of the NR frequencies is provided to the SN because it may be needed for measurement co-ordination (this information together with maxMeasFreqSCG-NR ensure the UE's allowed total number of measurements are not exceeded) and also for as an assistance information in case a per FR gap is to be set (i.e. so that the SN can determine the proper gap. For example, the SN may configure the UE with a gap configuration with a long gap duration if there are several NR measurements configured on FR2).

One difference between the measConfigSN provided in the CG-Config message and the measConfigMN in the CG-ConfigInfo is that no gap information is provided in the former. This is because even if a per FR gap is to be configured (i.e. FR2 gap is to be set by the SN), the MN can only configure serving cells on FR1 frequencies, and as such it doesn't need to know the FR2 gaps since that doesn't affect the scheduling on FR1 frequencies.

Thus, in the embodiments described above, the MN receives a notification from the secondary node that it will perform a secondary node amendment procedure; and it sends a message to the secondary node in response to said notification, wherein said message includes gap configuration information.

The notification sent from the secondary node may be a notification (for example a Secondary gNB (sgNB) Addition Request Acknowledge message or a Secondary gNB (sgNB) Modification Request Acknowledge message) that is sent in response to a request from the MN, or the notification sent from the secondary node may be a message (such as a Secondary gNB (sgNB) Modification Required message) that is independent of any request from the MN.

The message sent to the secondary node may be a SgNB Reconfiguration Complete message or a SgNB Modification Confirm message that is modified to include gap configuration information. The message sent to the secondary node may thus include the CG-ConfigInfo message.

In the examples given above, the modified SgNB Reconfiguration Complete message or SgNB Modification Confirm message includes the CG-ConfigInfo message in a separate MeNB to SgNB container. However, there are alternatives to this. In another example, there is just one MeNB to SgNB container which is enhanced to be a list with two elements, the NR RRCReconfigurationComplete and the SCG-ConfigInfo IEs. Again, another option can be to use a list of RRC containers.

It should also be noted that instead of the SCG-ConfigInfo IE, an IE just including the measurement gap (e.g. the measConfigSN IE or a new IE) could be used.

The methods described above will eliminate the need to initiate an sgNB modification procedure just to communicate the measurement gap. However, there can still be some limited time duration between the UE's reception of the RRC configuration message with the new measurement and measurement gaps (message 503 in FIG. 5 and 603 in FIG. 6) until the sgNB reconfiguration complete message is received (message 505 of FIG. 5 and message 606 of FIG. 6) where the SN might not be aware of the gap configuration the UE is applying (i.e. there is still some room for data loss). One solution to this problem is that the MN, after step 502 or 602, initiates a further SgNB Modification procedure and provides the new gaps to the SN in the SgNB Modification Request message.

The situation is similar in FIG. 7 (duration between the reception of message 704 at the UE and the reception of message 706 at the SN). One possible solution with reference to the procedure in FIG. 7, is that the MN sends the new gaps to the SN in step 702 using the SgNB Modification Request message.

In further embodiments, the delay in applying the gap configuration at the SN is dealt with by introducing a new message, which can be sent from the MN to the SN immediately after the reception of message 502 or 602 in FIG. 5 or 6, or after message 701 in FIG. 7. This means that the SN will be aware of the gaps that are to be applied by the UE and can refrain from transmitting/scheduling the UE on those gaps immediately.

In further embodiments, the SN will pause the transmission or scheduling of data until it has got the gap information from the MN (or until it gets a confirmation that the procedure, e.g. SgNB Modification Required, has ended). It should be noted that, meanwhile, already scheduled UL data can still be received by the SN. Once the SN receives the gap information, it will resume the transmission/scheduling of the UL and DL, while respecting the UE's measurement gap configuration.

A further alternative is for the MN to run the SgNB Modification procedure, including notifying the SN of the gap configuration information, before sending the RRC message to the UE.

Figure 9:
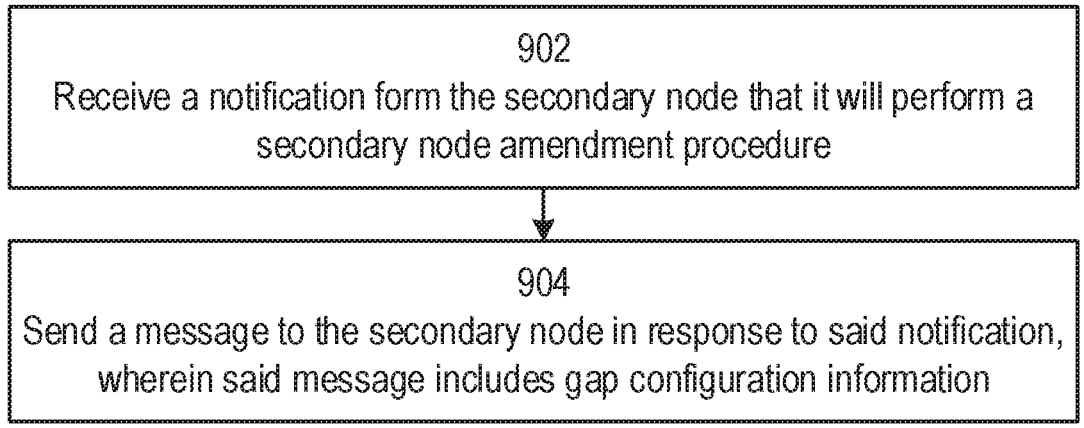
FIG. 9 is a flow chart, illustrating a first method in accordance with an aspect of the disclosure.

In summary, FIG. 9 is a flow chart, illustrating a method in accordance with some embodiments. Specifically, FIG. 9 depicts a method in accordance with particular embodiments, performed by a network node operating as a master node (MN) in dual connectivity with a secondary node (SN) for measurement gap configuration. The method begins at step 902 with receiving a notification from the secondary node that it will perform a secondary node amendment procedure. At step 904, the MN sends a message to the secondary node in response to said notification, wherein said message includes gap configuration information.

Figure 10:
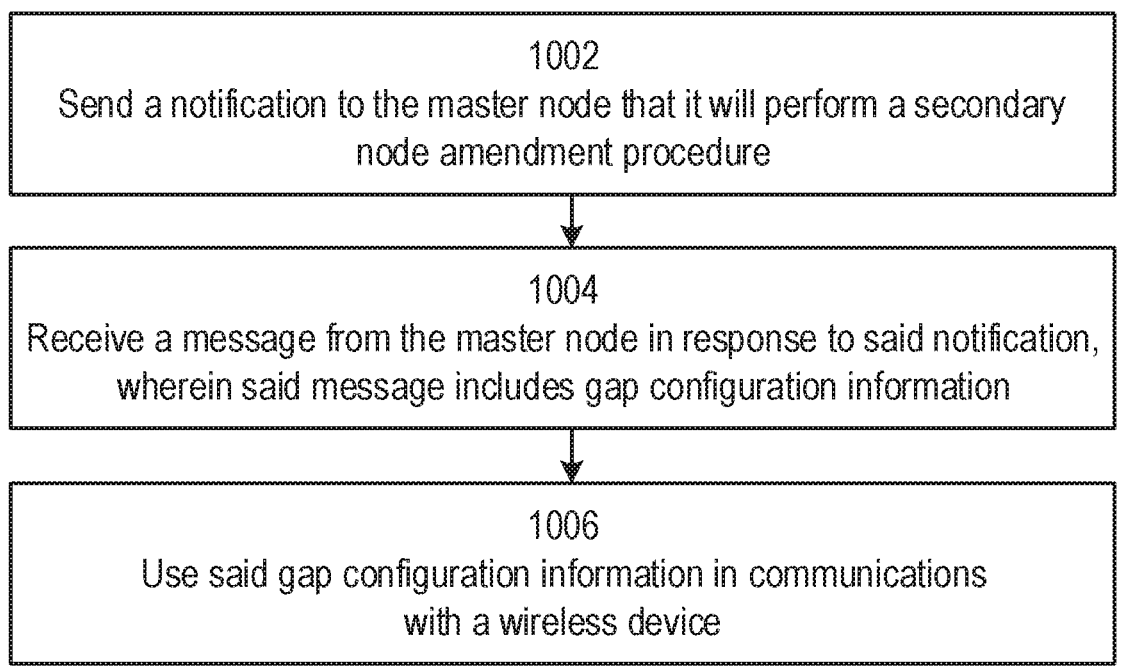
FIG. 10 is a flow chart, illustrating a second method in accordance with an aspect of the disclosure.

Further, FIG. 10 is a flow chart, illustrating a method in accordance with some embodiments. Specifically, FIG. 10 depicts a method performed by a network node operating as a secondary node (SN) in dual connectivity with a master node (MN) for measurement gap configuration. The method begins at step 1002, in which the SN sends a notification to the master node that it will perform a secondary node amendment procedure. In step 1004, the SN receives a message from the master node in response to said notification, wherein said message includes gap configuration information. In step 1006, the SN uses said gap configuration information in communications with a wireless device.

Figure 11:
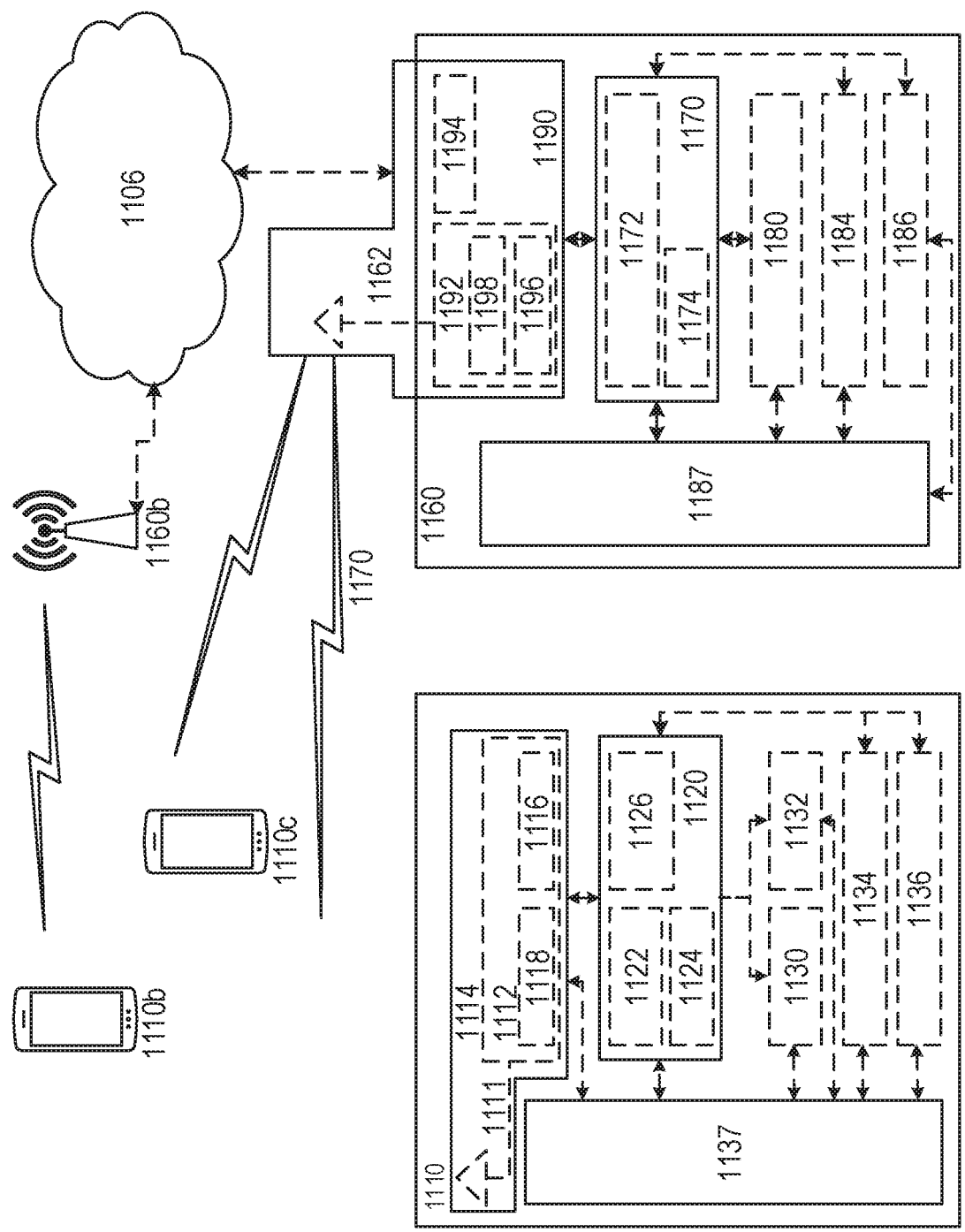
FIG. 11 illustrates a further aspect of a network in accordance with the disclosure.

FIG. 11 shows a wireless network in accordance with some embodiments. Although the subject matter described herein may be implemented in any appropriate type of system using any suitable components, the embodiments disclosed herein are described in relation to a wireless network, such as the example wireless network illustrated in FIG. 11. For simplicity, the wireless network of FIG. 11 only depicts network 1106, network nodes 1160 and 1160b, and WDs 1110, 1110b, and 1110c. In practice, a wireless network may further include any additional elements suitable to support communication between wireless devices or between a wireless device and another communication device, such as a landline telephone, a service provider, or any other network node or end device. In the methods described herein, one of the network nodes 1160 may be acting as the master node, MN, in a Dual Connectivity operation, while the other network node 1160b may be acting as the secondary node, SN. Of the illustrated components, network node 1160 and wireless device (WD) 1110 are depicted with additional detail. The other network node 1160b may be similar to the network node 1160, or identical with it. The wireless network may provide communication and other types of services to one or more wireless devices to facilitate the wireless devices' access to and/or use of the services provided by, or via, the wireless network.

The wireless network may comprise and/or interface with any type of communication, telecommunication, data, cellular, and/or radio network or other similar type of system. In some embodiments, the wireless network may be configured to operate according to specific standards or other types of predefined rules or procedures. Thus, particular embodiments of the wireless network may implement communication standards, such as Global System for Mobile Communications (GSM), Universal Mobile Telecommunications System (UMTS), Long Term Evolution (LTE), and/or other suitable 2G, 3G, 4G, or 5G standards; wireless local area network (WLAN) standards, such as the IEEE 802.11 standards; and/or any other appropriate wireless communication standard, such as the Worldwide Interoperability for Microwave Access (WiMax), Bluetooth, Z-Wave and/or ZigBee standards.

Network 1106 may comprise one or more backhaul networks, core networks, IP networks, public switched telephone networks (PSTNs), packet data networks, optical networks, wide-area networks (WANs), local area networks (LANs), wireless local area networks (WLANs), wired networks, wireless networks, metropolitan area networks, and other networks to enable communication between devices.

Network node 1160 and WD 1110 comprise various components described in more detail below. These components work together in order to provide network node and/or wireless device functionality, such as providing wireless connections in a wireless network. In different embodiments, the wireless network may comprise any number of wired or wireless networks, network nodes, base stations, controllers, wireless devices, relay stations, and/or any other components or systems that may facilitate or participate in the communication of data and/or signals whether via wired or wireless connections.

As used herein, network node refers to equipment capable, configured, arranged and/or operable to communicate directly or indirectly with a wireless device and/or with other network nodes or equipment in the wireless network to enable and/or provide wireless access to the wireless device and/or to perform other functions (e.g., administration) in the wireless network. Examples of network nodes include, but are not limited to, access points (APs) (e.g., radio access points), base stations (BSs) (e.g., radio base stations, Node Bs, evolved Node Bs (eNBs) and NR NodeBs (gNBs)). Base stations may be categorized based on the amount of coverage they provide (or, stated differently, their transmit power level) and may then also be referred to as femto base stations, pico base stations, micro base stations, or macro base stations. A base station may be a relay node or a relay donor node controlling a relay. A network node may also include one or more (or all) parts of a distributed radio base station such as centralized digital units and/or remote radio units (RRUs), sometimes referred to as Remote Radio Heads (RRHs). Such remote radio units may or may not be integrated with an antenna as an antenna integrated radio. Parts of a distributed radio base station may also be referred to as nodes in a distributed antenna system (DAS). Yet further examples of network nodes include multi-standard radio (MSR) equipment such as MSR BSs, network controllers such as radio network controllers (RNCs) or base station controllers (BSCs), base transceiver stations (BTSs), transmission points, transmission nodes, multi-cell/multicast coordination entities (MCEs), core network nodes (e.g., MSCs, MMEs), O&M nodes, OSS nodes, SON nodes, positioning nodes (e.g., E-SMLCs), and/or MDTs. As another example, a network node may be a virtual network node as described in more detail below. More generally, however, network nodes may represent any suitable device (or group of devices) capable, configured, arranged, and/or operable to enable and/or provide a wireless device with access to the wireless network or to provide some service to a wireless device that has accessed the wireless network.

In FIG. 11, network node 1160 includes processing circuitry 1170, device readable medium 1180, interface 1190, auxiliary equipment 1184, power source 1186, power circuitry 1187, and antenna 1162. Although network node 1160 illustrated in the example wireless network of FIG. 11 may represent a device that includes the illustrated combination of hardware components, other embodiments may comprise network nodes with different combinations of components. It is to be understood that a network node comprises any suitable combination of hardware and/or software needed to perform the tasks, features, functions and methods disclosed herein. Moreover, while the components of network node 1160 are depicted as single boxes located within a larger box, or nested within multiple boxes, in practice, a network node may comprise multiple different physical components that make up a single illustrated component (e.g., device readable medium 1180 may comprise multiple separate hard drives as well as multiple RAM modules).

Similarly, network node 1160 may be composed of multiple physically separate components (e.g., a NodeB component and a RNC component, or a BTS component and a BSC component, etc.), which may each have their own respective components. In certain scenarios in which network node 1160 comprises multiple separate components (e.g., BTS and BSC components), one or more of the separate components may be shared among several network nodes. For example, a single RNC may control multiple NodeB's. In such a scenario, each unique NodeB and RNC pair, may in some instances be considered a single separate network node. In some embodiments, network node 1160 may be configured to support multiple radio access technologies (RATs). In such embodiments, some components may be duplicated (e.g., separate device readable medium 1180 for the different RATs) and some components may be reused (e.g., the same antenna 1162 may be shared by the RATs). Network node 1160 may also include multiple sets of the various illustrated components for different wireless technologies integrated into network node 1160, such as, for example, GSM, WCDMA, LTE, NR, WiFi, or Bluetooth wireless technologies. These wireless technologies may be integrated into the same or different chip or set of chips and other components within network node 1160.

Processing circuitry 1170 is configured to perform any determining, calculating, or similar operations (e.g., certain obtaining operations) described herein as being provided by a network node. These operations performed by processing circuitry 1170 may include processing information obtained by processing circuitry 1170 by, for example, converting the obtained information into other information, comparing the obtained information or converted information to information stored in the network node, and/or performing one or more operations based on the obtained information or converted information, and as a result of said processing making a determination.

Processing circuitry 1170 may comprise a combination of one or more of a microprocessor, controller, microcontroller, central processing unit, digital signal processor, application-specific integrated circuit, field programmable gate array, or any other suitable computing device, resource, or combination of hardware, software and/or encoded logic operable to provide, either alone or in conjunction with other network node 1160 components, such as device readable medium 1180, network node 1160 functionality. For example, processing circuitry 1170 may execute instructions stored in device readable medium 1180 or in memory within processing circuitry 1170. Such functionality may include providing any of the various wireless features, functions, or benefits discussed herein. In some embodiments, processing circuitry 1170 may include a system on a chip (SOC). In some embodiments, processing circuitry 1170 may include one or more of radio frequency (RF) transceiver circuitry 1172 and baseband processing circuitry 1174. In some embodiments, radio frequency (RF) transceiver circuitry 1172 and baseband processing circuitry 1174 may be on separate chips (or sets of chips), boards, or units, such as radio units and digital units. In alternative embodiments, part or all of RF transceiver circuitry 1172 and baseband processing circuitry 1174 may be on the same chip or set of chips, boards, or units In certain embodiments, some or all of the functionality described herein as being provided by a network node, base station, eNB or other such network device may be performed by processing circuitry 1170 executing instructions stored on device readable medium 1180 or memory within processing circuitry 1170. In alternative embodiments, some or all of the functionality may be provided by processing circuitry 1170 without executing instructions stored on a separate or discrete device readable medium, such as in a hard-wired manner. In any of those embodiments, whether executing instructions stored on a device readable storage medium or not, processing circuitry 1170 can be configured to perform the described functionality. The benefits provided by such functionality are not limited to processing circuitry 1170 alone or to other components of network node 1160, but are enjoyed by network node 1160 as a whole, and/or by end users and the wireless network generally.

Device readable medium 1180 may comprise any form of volatile or non-volatile computer readable memory including, without limitation, persistent storage, solid-state memory, remotely mounted memory, magnetic media, optical media, random access memory (RAM), read-only memory (ROM), mass storage media (for example, a hard disk), removable storage media (for example, a flash drive, a Compact Disk (CD) or a Digital Video Disk (DVD)), and/or any other volatile or non-volatile, non-transitory device readable and/or computer-executable memory devices that store information, data, and/or instructions that may be used by processing circuitry 1170. Device readable medium 1180 may store any suitable instructions, data or information, including a computer program, software, an application including one or more of logic, rules, code, tables, etc. and/or other instructions capable of being executed by processing circuitry 1170 and, utilized by network node 1160. Device readable medium 1180 may be used to store any calculations made by processing circuitry 1170 and/or any data received via interface 1190. In some embodiments, processing circuitry 1170 and device readable medium 1180 may be considered to be integrated.

Interface 1190 is used in the wired or wireless communication of signalling and/or data between network node 1160, network 1106, and/or WDs 1110. As illustrated, interface 1190 comprises port(s)/terminal(s) 1194 to send and receive data, for example to and from network 1106 over a wired connection. Interface 1190 also includes radio front end circuitry 1192 that may be coupled to, or in certain embodiments a part of, antenna 1162. Radio front end circuitry 1192 comprises filters 1198 and amplifiers 1196. Radio front end circuitry 1192 may be connected to antenna 1162 and processing circuitry 1170. Radio front end circuitry may be configured to condition signals communicated between antenna 1162 and processing circuitry 1170. Radio front end circuitry 1192 may receive digital data that is to be sent out to other network nodes or WDs via a wireless connection. Radio front end circuitry 1192 may convert the digital data into a radio signal having the appropriate channel and bandwidth parameters using a combination of filters 1198 and/or amplifiers 1196. The radio signal may then be transmitted via antenna 1162. Similarly, when receiving data, antenna 1162 may collect radio signals which are then converted into digital data by radio front end circuitry 1192. The digital data may be passed to processing circuitry 1170. In other embodiments, the interface may comprise different components and/or different combinations of components. In certain alternative embodiments, network node 1160 may not include separate radio front end circuitry 1192, instead, processing circuitry 1170 may comprise radio front end circuitry and may be connected to antenna 1162 without separate radio front end circuitry 1192. Similarly, in some embodiments, all or some of RF transceiver circuitry 1172 may be considered a part of interface 1190. In still other embodiments, interface 1190 may include one or more ports or terminals 1194, radio front end circuitry 1192, and RF transceiver circuitry 1172, as part of a radio unit (not shown), and interface 1190 may communicate with baseband processing circuitry 1174, which is part of a digital unit (not shown).

Antenna 1162 may include one or more antennas, or antenna arrays, configured to send and/or receive wireless signals. Antenna 1162 may be coupled to radio front end circuitry 1190 and may be any type of antenna capable of transmitting and receiving data and/or signals wirelessly. In some embodiments, antenna 1162 may comprise one or more omni-directional, sector or panel antennas operable to transmit/receive radio signals between, for example, 2 GHz and 66 GHz. An omni-directional antenna may be used to transmit/receive radio signals in any direction, a sector antenna may be used to transmit/receive radio signals from devices within a particular area, and a panel antenna may be a line of sight antenna used to transmit/receive radio signals in a relatively straight line. In some instances, the use of more than one antenna may be referred to as MIMO. In certain embodiments, antenna 1162 may be separate from network node 1160 and may be connectable to network node 1160 through an interface or port.

Antenna 1162, interface 1190, and/or processing circuitry 1170 may be configured to perform any receiving operations and/or certain obtaining operations described herein as being performed by a network node. Any information, data and/or signals may be received from a wireless device, another network node and/or any other network equipment. Similarly, antenna 1162, interface 1190, and/or processing circuitry 1170 may be configured to perform any transmitting operations described herein as being performed by a network node. Any information, data and/or signals may be transmitted to a wireless device, another network node and/or any other network equipment.

Power circuitry 1187 may comprise, or be coupled to, power management circuitry and is configured to supply the components of network node 1160 with power for performing the functionality described herein. Power circuitry 1187 may receive power from power source 1186. Power source 1186 and/or power circuitry 1187 may be configured to provide power to the various components of network node 1160 in a form suitable for the respective components (e.g., at a voltage and current level needed for each respective component). Power source 1186 may either be included in, or external to, power circuitry 1187 and/or network node 1160. For example, network node 1160 may be connectable to an external power source (e.g., an electricity outlet) via an input circuitry or interface such as an electrical cable, whereby the external power source supplies power to power circuitry 1187. As a further example, power source 1186 may comprise a source of power in the form of a battery or battery pack which is connected to, or integrated in, power circuitry 1187. The battery may provide backup power should the external power source fail. Other types of power sources, such as photovoltaic devices, may also be used. Alternative embodiments of network node 1160 may include additional components beyond those shown in FIG. 11 that may be responsible for providing certain aspects of the network node's functionality, including any of the functionality described herein and/or any functionality necessary to support the subject matter described herein. For example, network node 1160 may include user interface equipment to allow input of information into network node 1160 and to allow output of information from network node 1160. This may allow a user to perform diagnostic, maintenance, repair, and other administrative functions for network node 1160.

As used herein, wireless device (WD) refers to a device capable, configured, arranged and/or operable to communicate wirelessly with network nodes and/or other wireless devices. Unless otherwise noted, the term WD may be used interchangeably herein with user equipment (UE). Communicating wirelessly may involve transmitting and/or receiving wireless signals using electromagnetic waves, radio waves, infrared waves, and/or other types of signals suitable for conveying information through air. In some embodiments, a WD may be configured to transmit and/or receive information without direct human interaction. For instance, a WD may be designed to transmit information to a network on a predetermined schedule, when triggered by an internal or external event, or in response to requests from the network. Examples of a WD include, but are not limited to, a smart phone, a mobile phone, a cell phone, a voice over IP (VoIP) phone, a wireless local loop phone, a desktop computer, a personal digital assistant (PDA), a wireless cameras, a gaming console or device, a music storage device, a playback appliance, a wearable terminal device, a wireless endpoint, a mobile station, a tablet, a laptop, a laptop-embedded equipment (LEE), a laptop-mounted equipment (LME), a smart device, a wireless customer-premise equipment (CPE), a vehicle-mounted wireless terminal device, etc. A WD may support device-to-device (D2D) communication, for example by implementing a 3GPP standard for sidelink communication, vehicle-to-vehicle (V2V), vehicle-to-infrastructure (V2I), vehicle-to-everything (V2X) and may in this case be referred to as a D2D communication device. As yet another specific example, in an Internet of Things (IoT) scenario, a WD may represent a machine or other device that performs monitoring and/or measurements, and transmits the results of such monitoring and/or measurements to another WD and/or a network node. The WD may in this case be a machine-to-machine (M2M) device, which may in a 3GPP context be referred to as an MTC device. As one particular example, the WD may be a UE implementing the 3GPP narrow band internet of things (NB-IoT) standard. Particular examples of such machines or devices are sensors, metering devices such as power meters, industrial machinery, or home or personal appliances (e.g. refrigerators, televisions, etc.) personal wearables (e.g., watches, fitness trackers, etc.). In other scenarios, a WD may represent a vehicle or other equipment that is capable of monitoring and/or reporting on its operational status or other functions associated with its operation. A WD as described above may represent the endpoint of a wireless connection, in which case the device may be referred to as a wireless terminal. Furthermore, a WD as described above may be mobile, in which case it may also be referred to as a mobile device or a mobile terminal.

As illustrated, wireless device 1110 includes antenna 1111, interface 1114, processing circuitry 1120, device readable medium 1130, user interface equipment 1132, auxiliary equipment 1134, power source 1136 and power circuitry 1137. WD 1110 may include multiple sets of one or more of the illustrated components for different wireless technologies supported by WD 1110, such as, for example, GSM, WCDMA, LTE, NR, WiFi, WiMAX, or Bluetooth wireless technologies, just to mention a few. These wireless technologies may be integrated into the same or different chips or set of chips as other components within WD 1110.

Antenna 1111 may include one or more antennas or antenna arrays, configured to send and/or receive wireless signals, and is connected to interface 1114. In certain alternative embodiments, antenna 1111 may be separate from WD 1110 and be connectable to WD 1110 through an interface or port. Antenna 1111, interface 1114, and/or processing circuitry 1120 may be configured to perform any receiving or transmitting operations described herein as being performed by a WD. Any information, data and/or signals may be received from a network node and/or another WD. In some embodiments, radio front end circuitry and/or antenna 1111 may be considered an interface.

As illustrated, interface 1114 comprises radio front end circuitry 1112 and antenna 1111. Radio front end circuitry 1112 comprise one or more filters 1118 and amplifiers 1116. Radio front end circuitry 1114 is connected to antenna 1111 and processing circuitry 1120, and is configured to condition signals communicated between antenna 1111 and processing circuitry 1120. Radio front end circuitry 1112 may be coupled to or a part of antenna 1111. In some embodiments, WD 1110 may not include separate radio front end circuitry 1112; rather, processing circuitry 1120 may comprise radio front end circuitry and may be connected to antenna 1111. Similarly, in some embodiments, some or all of RF transceiver circuitry 1122 may be considered a part of interface 1114. Radio front end circuitry 1112 may receive digital data that is to be sent out to other network nodes or WDs via a wireless connection. Radio front end circuitry 1112 may convert the digital data into a radio signal having the appropriate channel and bandwidth parameters using a combination of filters 1118 and/or amplifiers 1116. The radio signal may then be transmitted via antenna 1111. Similarly, when receiving data, antenna 1111 may collect radio signals which are then converted into digital data by radio front end circuitry 1112. The digital data may be passed to processing circuitry 1120. In other embodiments, the interface may comprise different components and/or different combinations of components.

Processing circuitry 1120 may comprise a combination of one or more of a microprocessor, controller, microcontroller, central processing unit, digital signal processor, application-specific integrated circuit, field programmable gate array, or any other suitable computing device, resource, or combination of hardware, software, and/or encoded logic operable to provide, either alone or in conjunction with other WD 1110 components, such as device readable medium 1130, WD 1110 functionality. Such functionality may include providing any of the various wireless features or benefits discussed herein. For example, processing circuitry 1120 may execute instructions stored in device readable medium 1130 or in memory within processing circuitry 1120 to provide the functionality disclosed herein.

As illustrated, processing circuitry 1120 includes one or more of RF transceiver circuitry 1122, baseband processing circuitry 1124, and application processing circuitry 1126. In other embodiments, the processing circuitry may comprise different components and/or different combinations of components. In certain embodiments processing circuitry 1120 of WD 1110 may comprise a SOC. In some embodiments, RF transceiver circuitry 1122, baseband processing circuitry 1124, and application processing circuitry 1126 may be on separate chips or sets of chips. In alternative embodiments, part or all of baseband processing circuitry 1124 and application processing circuitry 1126 may be combined into one chip or set of chips, and RF transceiver circuitry 1122 may be on a separate chip or set of chips. In still alternative embodiments, part or all of RF transceiver circuitry 1122 and baseband processing circuitry 1124 may be on the same chip or set of chips, and application processing circuitry 1126 may be on a separate chip or set of chips. In yet other alternative embodiments, part or all of RF transceiver circuitry 1122, baseband processing circuitry 1124, and application processing circuitry 1126 may be combined in the same chip or set of chips. In some embodiments, RF transceiver circuitry 1122 may be a part of interface 1114. RF transceiver circuitry 1122 may condition RF signals for processing circuitry 1120.

In certain embodiments, some or all of the functionality described herein as being performed by a WD may be provided by processing circuitry 1120 executing instructions stored on device readable medium 1130, which in certain embodiments may be a computer-readable storage medium. In alternative embodiments, some or all of the functionality may be provided by processing circuitry 1120 without executing instructions stored on a separate or discrete device readable storage medium, such as in a hard-wired manner. In any of those particular embodiments, whether executing instructions stored on a device readable storage medium or not, processing circuitry 1120 can be configured to perform the described functionality. The benefits provided by such functionality are not limited to processing circuitry 1120 alone or to other components of WD 1110, but are enjoyed by WD 1110 as a whole, and/or by end users and the wireless network generally.

Processing circuitry 1120 may be configured to perform any determining, calculating, or similar operations (e.g., certain obtaining operations) described herein as being performed by a WD. These operations, as performed by processing circuitry 1120, may include processing information obtained by processing circuitry 1120 by, for example, converting the obtained information into other information, comparing the obtained information or converted information to information stored by WD 1110, and/or performing one or more operations based on the obtained information or converted information, and as a result of said processing making a determination.

Device readable medium 1130 may be operable to store a computer program, software, an application including one or more of logic, rules, code, tables, etc. and/or other instructions capable of being executed by processing circuitry 1120. Device readable medium 1130 may include computer memory (e.g., Random Access Memory (RAM) or Read Only Memory (ROM)), mass storage media (e.g., a hard disk), removable storage media (e.g., a Compact Disk (CD) or a Digital Video Disk (DVD)), and/or any other volatile or non-volatile, non-transitory device readable and/or computer executable memory devices that store information, data, and/or instructions that may be used by processing circuitry 1120. In some embodiments, processing circuitry 1120 and device readable medium 1130 may be considered to be integrated.

User interface equipment 1132 may provide components that allow for a human user to interact with WD 1110. Such interaction may be of many forms, such as visual, audial, tactile, etc. User interface equipment 1132 may be operable to produce output to the user and to allow the user to provide input to WD 1110. The type of interaction may vary depending on the type of user interface equipment 1132 installed in WD 1110. For example, if WD 1110 is a smart phone, the interaction may be via a touch screen; if WD 1110 is a smart meter, the interaction may be through a screen that provides usage (e.g., the number of gallons used) or a speaker that provides an audible alert (e.g., if smoke is detected). User interface equipment 1132 may include input interfaces, devices and circuits, and output interfaces, devices and circuits. User interface equipment 1132 is configured to allow input of information into WD 1110, and is connected to processing circuitry 1120 to allow processing circuitry 1120 to process the input information. User interface equipment 1132 may include, for example, a microphone, a proximity or other sensor, keys/buttons, a touch display, one or more cameras, a USB port, or other input circuitry. User interface equipment 1132 is also configured to allow output of information from WD 1110, and to allow processing circuitry 1120 to output information from WD 1110. User interface equipment 1132 may include, for example, a speaker, a display, vibrating circuitry, a USB port, a headphone interface, or other output circuitry. Using one or more input and output interfaces, devices, and circuits, of user interface equipment 1132, WD 1110 may communicate with end users and/or the wireless network, and allow them to benefit from the functionality described herein.

Auxiliary equipment 1134 is operable to provide more specific functionality which may not be generally performed by WDs. This may comprise specialized sensors for doing measurements for various purposes, interfaces for additional types of communication such as wired communications etc. The inclusion and type of components of auxiliary equipment 1134 may vary depending on the embodiment and/or scenario.

Power source 1136 may, in some embodiments, be in the form of a battery or battery pack. Other types of power sources, such as an external power source (e.g., an electricity outlet), photovoltaic devices or power cells, may also be used. WD 1110 may further comprise power circuitry 1137 for delivering power from power source 1136 to the various parts of WD 1110 which need power from power source 1136 to carry out any functionality described or indicated herein. Power circuitry 1137 may in certain embodiments comprise power management circuitry. Power circuitry 1137 may additionally or alternatively be operable to receive power from an external power source; in which case WD 1110 may be connectable to the external power source (such as an electricity outlet) via input circuitry or an interface such as an electrical power cable. Power circuitry 1137 may also in certain embodiments be operable to deliver power from an external power source to power source 1136. This may be, for example, for the charging of power source 1136. Power circuitry 1137 may perform any formatting, converting, or other modification to the power from power source 1136 to make the power suitable for the respective components of WD 1110 to which power is supplied.

Figure 12:
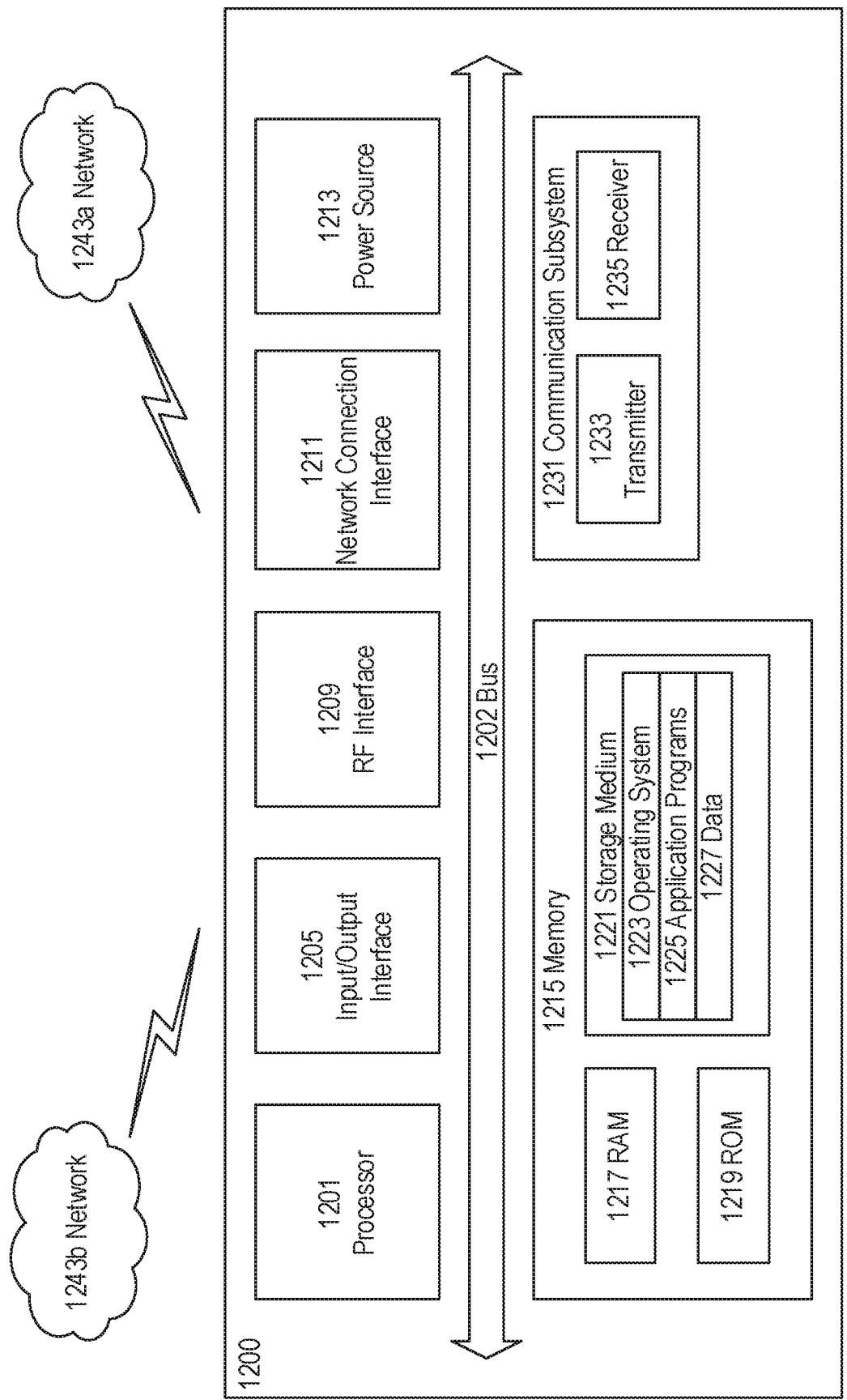
FIG. 12 illustrates a further aspect of a network in accordance with the disclosure.

FIG. 12 illustrates one embodiment of a UE in accordance with various aspects described herein. As used herein, a user equipment or UE may not necessarily have a user in the sense of a human user who owns and/or operates the relevant device. Instead, a UE may represent a device that is intended for sale to, or operation by, a human user but which may not, or which may not initially, be associated with a specific human user (e.g., a smart sprinkler controller). Alternatively, a UE may represent a device that is not intended for sale to, or operation by, an end user but which may be associated with or operated for the benefit of a user (e.g., a smart power meter). UE 1200 may be any UE identified by the $3^{rd}$ Generation Partnership Project (3GPP), including a NB-IoT UE, a machine type communication (MTC) UE, and/or an enhanced MTC (eMTC) UE. UE 1200, as illustrated in FIG. 12, is one example of a WD configured for communication in accordance with one or more communication standards promulgated by the $3^{rd}$ Generation Partnership Project (3GPP), such as 3GPP's GSM, UMTS, LTE, and/or 5G standards. As mentioned previously, the term WD and UE may be used interchangeable. Accordingly, although FIG. 12 is a UE, the components discussed herein are equally applicable to a WD, and vice-versa.

In FIG. 12, UE 1200 includes processing circuitry 1201 that is operatively coupled to input/output interface 1205, radio frequency (RF) interface 1209, network connection interface 1211, memory 1215 including random access memory (RAM) 1217, read-only memory (ROM) 1219, and storage medium 1221 or the like, communication subsystem 1231, power source 1233, and/or any other component, or any combination thereof. Storage medium 1221 includes operating system 1223, application program 1225, and data 1227. In other embodiments, storage medium 1221 may include other similar types of information. Certain UEs may utilize all of the components shown in FIG. 12, or only a subset of the components. The level of integration between the components may vary from one UE to another UE. Further, certain UEs may contain multiple instances of a component, such as multiple processors, memories, transceivers, transmitters, receivers, etc. In FIG. 12, processing circuitry 1201 may be configured to process computer instructions and data. Processing circuitry 1201 may be configured to implement any sequential state machine operative to execute machine instructions stored as machine-readable computer programs in the memory, such as one or more hardware-implemented state machines (e.g., in discrete logic, FPGA, ASIC, etc.); programmable logic together with appropriate firmware; one or more stored program, general-purpose processors, such as a microprocessor or Digital Signal Processor (DSP), together with appropriate software; or any combination of the above. For example, the processing circuitry 1201 may include two central processing units (CPUs). Data may be information in a form suitable for use by a computer.

In the depicted embodiment, input/output interface 1205 may be configured to provide a communication interface to an input device, output device, or input and output device. UE 1200 may be configured to use an output device via input/output interface 1205. An output device may use the same type of interface port as an input device. For example, a USB port may be used to provide input to and output from UE 1200. The output device may be a speaker, a sound card, a video card, a display, a monitor, a printer, an actuator, an emitter, a smartcard, another output device, or any combination thereof. UE 1200 may be configured to use an input device via input/output interface 1205 to allow a user to capture information into UE 1200. The input device may include a touch-sensitive or presence-sensitive display, a camera (e.g., a digital camera, a digital video camera, a web camera, etc.), a microphone, a sensor, a mouse, a trackball, a directional pad, a trackpad, a scroll wheel, a smartcard, and the like. The presence-sensitive display may include a capacitive or resistive touch sensor to sense input from a user. A sensor may be, for instance, an accelerometer, a gyroscope, a tilt sensor, a force sensor, a magnetometer, an optical sensor, a proximity sensor, another like sensor, or any combination thereof. For example, the input device may be an accelerometer, a magnetometer, a digital camera, a microphone, and an optical sensor. In FIG. 12, RF interface 1209 may be configured to provide a communication interface to RF components such as a transmitter, a receiver, and an antenna. Network connection interface 1211 may be configured to provide a communication interface to network 1243a. Network 1243a may encompass wired and/or wireless networks such as a local-area network (LAN), a wide-area network (WAN), a computer network, a wireless network, a telecommunications network, another like network or any combination thereof. For example, network 1243a may comprise a Wi-Fi network. Network connection interface 1211 may be configured to include a receiver and a transmitter interface used to communicate with one or more other devices over a communication network according to one or more communication protocols, such as Ethernet, TCP/IP, SONET, ATM, or the like. Network connection interface 1211 may implement receiver and transmitter functionality appropriate to the communication network links (e.g., optical, electrical, and the like). The transmitter and receiver functions may share circuit components, software or firmware, or alternatively may be implemented separately.

RAM 1217 may be configured to interface via bus 1202 to processing circuitry 1201 to provide storage or caching of data or computer instructions during the execution of software programs such as the operating system, application programs, and device drivers. ROM 1219 may be configured to provide computer instructions or data to processing circuitry 1201. For example, ROM 1219 may be configured to store invariant low-level system code or data for basic system functions such as basic input and output (I/O), startup, or reception of keystrokes from a keyboard that are stored in a non-volatile memory. Storage medium 1221 may be configured to include memory such as RAM, ROM, programmable read-only memory (PROM), erasable programmable read-only memory (EPROM), electrically erasable programmable read-only memory (EEPROM), magnetic disks, optical disks, floppy disks, hard disks, removable cartridges, or flash drives. In one example, storage medium 1221 may be configured to include operating system 1223, application program 1225 such as a web browser application, a widget or gadget engine or another application, and data file 1227. Storage medium 1221 may store, for use by UE 1200, any of a variety of various operating systems or combinations of operating systems.

Storage medium 1221 may be configured to include a number of physical drive units, such as redundant array of independent disks (RAID), floppy disk drive, flash memory, USB flash drive, external hard disk drive, thumb drive, pen drive, key drive, high-density digital versatile disc (HD-DVD) optical disc drive, internal hard disk drive, Blu-Ray optical disc drive, holographic digital data storage (HDDS) optical disc drive, external mini-dual in-line memory module (DIMM), synchronous dynamic random access memory (SDRAM), external micro-DIMM SDRAM, smartcard memory such as a subscriber identity module or a removable user identity (SIM/RUIM) module, other memory, or any combination thereof. Storage medium 1221 may allow UE 1200 to access computer-executable instructions, application programs or the like, stored on transitory or non-transitory memory media, to off-load data, or to upload data. An article of manufacture, such as one utilizing a communication system may be tangibly embodied in storage medium 1221, which may comprise a device readable medium.

In FIG. 12, processing circuitry 1201 may be configured to communicate with network 1243b using communication subsystem 1231. Network 1243a and network 1243b may be the same network or networks or different network or networks. Communication subsystem 1231 may be configured to include one or more transceivers used to communicate with network 1243b. For example, communication subsystem 1231 may be configured to include one or more transceivers used to communicate with one or more remote transceivers of another device capable of wireless communication such as another WD, UE, or base station of a radio access network (RAN) according to one or more communication protocols, such as IEEE 802.11, CDMA, WCDMA, GSM, LTE, UTRAN, WiMax, or the like. Each transceiver may include transmitter 1233 and/or receiver 1235 to implement transmitter or receiver functionality, respectively, appropriate to the RAN links (e.g., frequency allocations and the like). Further, transmitter 1233 and receiver 1235 of each transceiver may share circuit components, software or firmware, or alternatively may be implemented separately.

In the illustrated embodiment, the communication functions of communication subsystem 1231 may include data communication, voice communication, multimedia communication, short-range communications such as Bluetooth, near-field communication, location-based communication such as the use of the global positioning system (GPS) to determine a location, another like communication function, or any combination thereof. For example, communication subsystem 1231 may include cellular communication, Wi-Fi communication, Bluetooth communication, and GPS communication. Network 1243*b* may encompass wired and/or wireless networks such as a local-area network (LAN), a wide-area network (WAN), a computer network, a wireless network, a telecommunications network, another like network or any combination thereof. For example, network 1243*b* may be a cellular network, a Wi-Fi network, and/or a near-field network. Power source 1213 may be configured to provide alternating current (AC) or direct current (DC) power to components of UE 1200.

The features, benefits and/or functions described herein may be implemented in one of the components of UE 1200 or partitioned across multiple components of UE 1200. Further, the features, benefits, and/or functions described herein may be implemented in any combination of hardware, software or firmware. In one example, communication subsystem 1231 may be configured to include any of the components described herein. Further, processing circuitry 1201 may be configured to communicate with any of such components over bus 1202. In another example, any of such components may be represented by program instructions stored in memory that when executed by processing circuitry 1201 perform the corresponding functions described herein. In another example, the functionality of any of such components may be partitioned between processing circuitry 1201 and communication subsystem 1231. In another example, the non-computationally intensive functions of any of such components may be implemented in software or firmware and the computationally intensive functions may be implemented in hardware.

Figure 13:
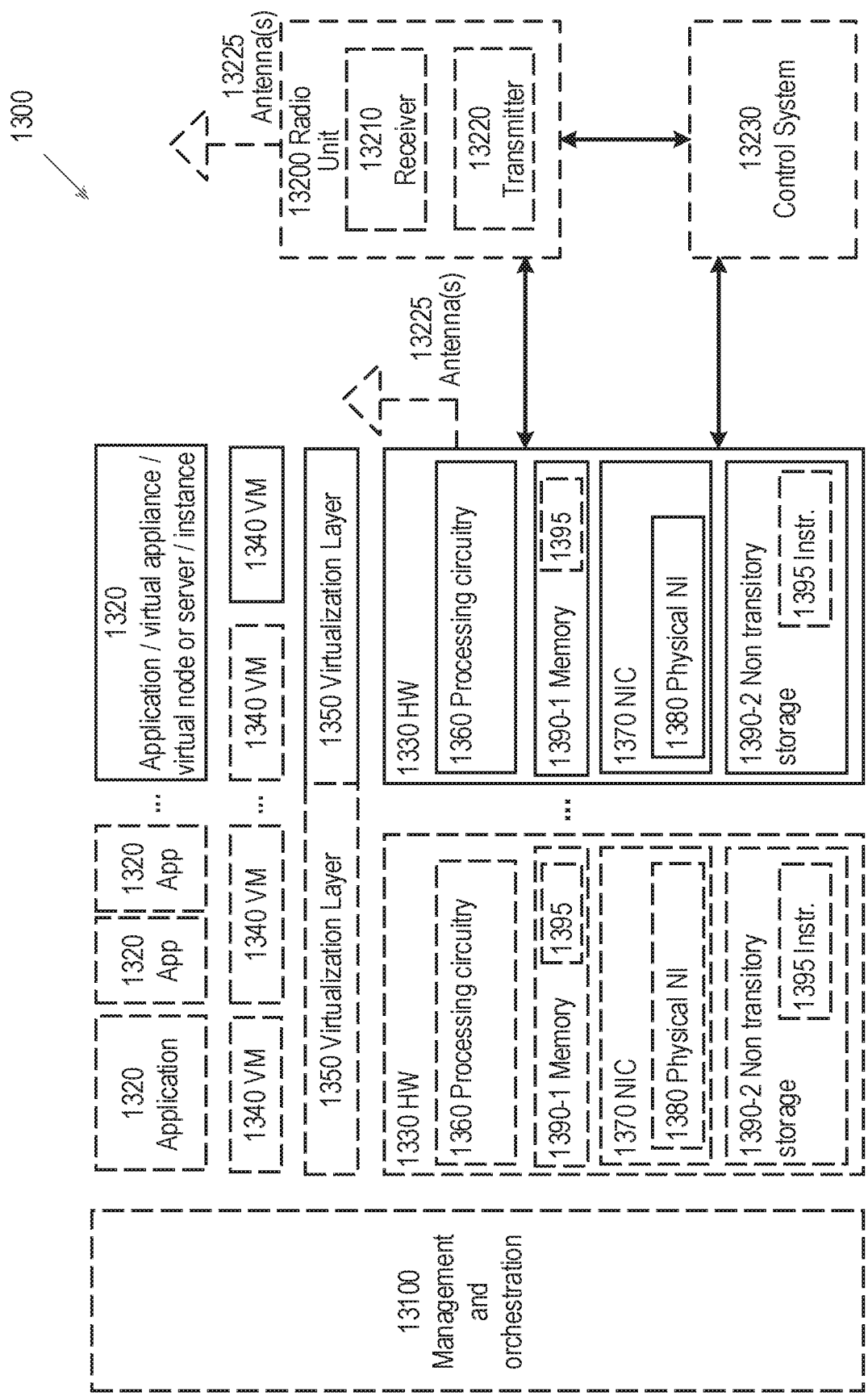
FIG. 13 illustrates a further aspect of a network in accordance with the disclosure.

FIG. 13 is a schematic block diagram illustrating a virtualization environment 1300 in which functions implemented by some embodiments may be virtualized. In the present context, virtualizing means creating virtual versions of apparatuses or devices which may include virtualizing hardware platforms, storage devices and networking resources. As used herein, virtualization can be applied to a node (e.g., a virtualized base station or a virtualized radio access node) or to a device (e.g., a UE, a wireless device or any other type of communication device) or components thereof and relates to an implementation in which at least a portion of the functionality is implemented as one or more virtual components (e.g., via one or more applications, components, functions, virtual machines or containers executing on one or more physical processing nodes in one or more networks).

In some embodiments, some or all of the functions described herein may be implemented as virtual components executed by one or more virtual machines implemented in one or more virtual environments 1300 hosted by one or more of hardware nodes 1330. Further, in embodiments in which the virtual node is not a radio access node or does not require radio connectivity (e.g., a core network node), then the network node may be entirely virtualized.

The functions may be implemented by one or more applications 1320 (which may alternatively be called software instances, virtual appliances, network functions, virtual nodes, virtual network functions, etc.) operative to implement some of the features, functions, and/or benefits of some of the embodiments disclosed herein. Applications 1320 are run in virtualization environment 1300 which provides hardware 1330 comprising processing circuitry 1360 and memory 1390. Memory 1390 contains instructions 1395 executable by processing circuitry 1360 whereby application 1320 is operative to provide one or more of the features, benefits, and/or functions disclosed herein.

Virtualization environment 1300, comprises general-purpose or special-purpose network hardware devices 1330 comprising a set of one or more processors or processing circuitry 1360, which may be commercial off-the-shelf (COTS) processors, dedicated Application Specific Integrated Circuits (ASICs), or any other type of processing circuitry including digital or analog hardware components or special purpose processors. Each hardware device may comprise memory 1390-1 which may be non-persistent memory for temporarily storing instructions 1395 or software executed by processing circuitry 1360. Each hardware device may comprise one or more network interface controllers (NICs) 1370, also known as network interface cards, which include physical network interface 1380. Each hardware device may also include non-transitory, persistent, machine-readable storage media 1390-2 having stored therein software 1395 and/or instructions executable by processing circuitry 1360. Software 1395 may include any type of software including software for instantiating one or more virtualization layers 1350 (also referred to as hypervisors), software to execute virtual machines 1340 as well as software allowing it to execute functions, features and/or benefits described in relation with some embodiments described herein.

Virtual machines 1340, comprise virtual processing, virtual memory, virtual networking or interface and virtual storage, and may be run by a corresponding virtualization layer 1350 or hypervisor. Different embodiments of the instance of virtual appliance 1320 may be implemented on one or more of virtual machines 1340, and the implementations may be made in different ways.

During operation, processing circuitry 1360 executes software 1395 to instantiate the hypervisor or virtualization layer 1350, which may sometimes be referred to as a virtual machine monitor (VMM). Virtualization layer 1350 may present a virtual operating platform that appears like networking hardware to virtual machine 1340. As shown in FIG. 13, hardware 1330 may be a standalone network node with generic or specific components. Hardware 1330 may comprise antenna 13225 and may implement some functions via virtualization. Alternatively, hardware 1330 may be part of a larger cluster of hardware (e.g. such as in a data center or customer premise equipment (CPE)) where many hardware nodes work together and are managed via management and orchestration (MANO) 13100, which, among others, oversees lifecycle management of applications 1320.

Virtualization of the hardware is in some contexts referred to as network function virtualization (NFV). NFV may be used to consolidate many network equipment types onto industry standard high volume server hardware, physical switches, and physical storage, which can be located in data centers, and customer premise equipment.

In the context of NFV, virtual machine 1340 may be a software implementation of a physical machine that runs programs as if they were executing on a physical, non-virtualized machine. Each of virtual machines 1340, and that part of hardware 1330 that executes that virtual machine, be it hardware dedicated to that virtual machine and/or hardware shared by that virtual machine with others of the virtual machines 1340, forms a separate virtual network elements (VNE).

Still in the context of NFV, Virtual Network Function (VNF) is responsible for handling specific network functions that run in one or more virtual machines 1340 on top of hardware networking infrastructure 1330 and corresponds to application 1320 in FIG. 13.

In some embodiments, one or more radio units 13200 that each include one or more transmitters 13220 and one or more receivers 13210 may be coupled to one or more antennas 13225. Radio units 13200 may communicate directly with hardware nodes 1330 via one or more appropriate network interfaces and may be used in combination with the virtual components to provide a virtual node with radio capabilities, such as a radio access node or a base station.

In some embodiments, some signalling can be effected with the use of control system 13230 which may alternatively be used for communication between the hardware nodes 1330 and radio units 13200.

Figure 14:
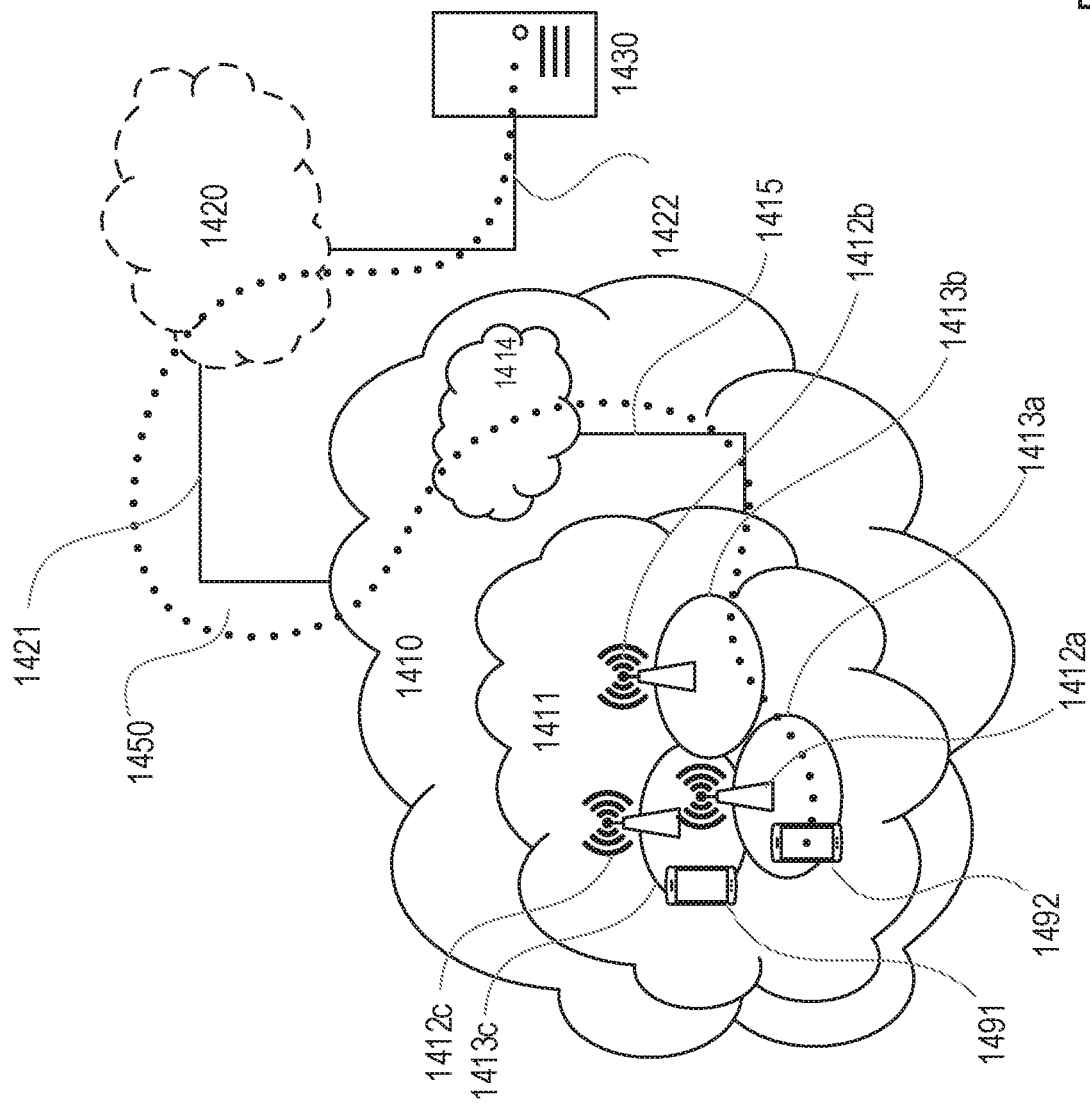
FIG. 14 illustrates a further aspect of a network in accordance with the disclosure.

FIG. 14 shows a telecommunication network connected via an intermediate network to a host computer in accordance with some embodiments.

With reference to FIG. 14, in accordance with an embodiment, a communication system includes telecommunication network 1410, such as a 3GPP-type cellular network, which comprises access network 1411, such as a radio access network, and core network 1414. Access network 1411 comprises a plurality of base stations 1412a, 1412b, 1412c, such as NBs, eNBs, gNBs or other types of wireless access points, each defining a corresponding coverage area 1413a, 1413b, 1413c. Each base station 1412a, 1412b, 1412c is connectable to core network 1414 over a wired or wireless connection 1415. A first UE 1491 located in coverage area 1413c is configured to wirelessly connect to, or be paged by, the corresponding base station 1412c. A second UE 1492 in coverage area 1413a is wirelessly connectable to the corresponding base station 1412a. While a plurality of UEs 1491, 1492 are illustrated in this example, the disclosed embodiments are equally applicable to a situation where a sole UE is in the coverage area or where a sole UE is connecting to the corresponding base station 1412.

Telecommunication network 1410 is itself connected to host computer 1430, which may be embodied in the hardware and/or software of a standalone server, a cloud-implemented server, a distributed server or as processing resources in a server farm. Host computer 1430 may be under the ownership or control of a service provider, or may be operated by the service provider or on behalf of the service provider. Connections 1421 and 1422 between telecommunication network 1410 and host computer 1430 may extend directly from core network 1414 to host computer 1430 or may go via an optional intermediate network 1420. Intermediate network 1420 may be one of, or a combination of more than one of, a public, private or hosted network; intermediate network 1420, if any, may be a backbone network or the Internet; in particular, intermediate network 1420 may comprise two or more sub-networks (not shown).

The communication system of FIG. 14 as a whole enables connectivity between the connected UEs 1491, 1492 and host computer 1430. The connectivity may be described as an over-the-top (OTT) connection 1450. Host computer 1430 and the connected UEs 1491, 1492 are configured to communicate data and/or signaling via OTT connection 1450, using access network 1411, core network 1414, any intermediate network 1420 and possible further infrastructure (not shown) as intermediaries. OTT connection 1450 may be transparent in the sense that the participating communication devices through which OTT connection 1450 passes are unaware of routing of uplink and downlink communications. For example, base station 1412 may not or need not be informed about the past routing of an incoming downlink communication with data originating from host computer 1430 to be forwarded (e.g., handed over) to a connected UE 1491. Similarly, base station 1412 need not be aware of the future routing of an outgoing uplink communication originating from the UE 1491 towards the host computer 1430.

Figure 15:
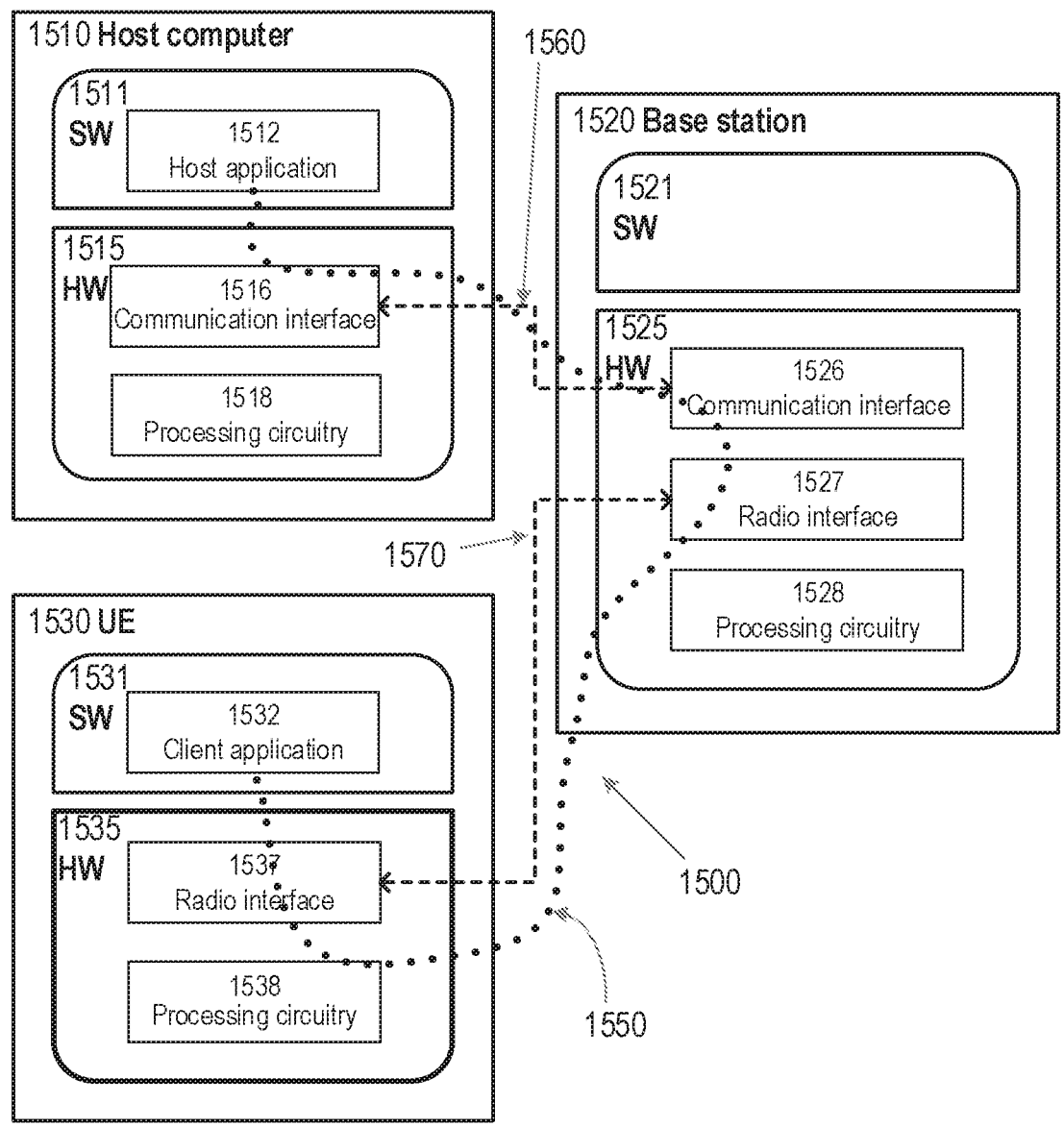
FIG. 15 illustrates a further aspect of a network in accordance with the disclosure.

FIG. 15 shows a host computer communicating via a base station with a user equipment over a partially wireless connection in accordance with some embodiments.

Example implementations, in accordance with an embodiment, of the UE, base station and host computer discussed in the preceding paragraphs will now be described with reference to FIG. 15. In communication system 1500, host computer 1510 comprises hardware 1515 including communication interface 1516 configured to set up and maintain a wired or wireless connection with an interface of a different communication device of communication system 1500. Host computer 1510 further comprises processing circuitry 1518, which may have storage and/or processing capabilities. In particular, processing circuitry 1518 may comprise one or more programmable processors, application-specific integrated circuits, field programmable gate arrays or combinations of these (not shown) adapted to execute instructions. Host computer 1510 further comprises software 1511, which is stored in or accessible by host computer 1510 and executable by processing circuitry 1518. Software 1511 includes host application 1512. Host application 1512 may be operable to provide a service to a remote user, such as UE 1530 connecting via OTT connection 1550 terminating at UE 1530 and host computer 1510. In providing the service to the remote user, host application 1512 may provide user data which is transmitted using OTT connection 1550.

Communication system 1500 further includes base station 1520 provided in a telecommunication system and comprising hardware 1525 enabling it to communicate with host computer 1510 and with UE 1530. Hardware 1525 may include communication interface 1526 for setting up and maintaining a wired or wireless connection with an interface of a different communication device of communication system 1500, as well as radio interface 1527 for setting up and maintaining at least wireless connection 1570 with UE 1530 located in a coverage area (not shown in FIG. 15) served by base station 1520. Communication interface 1526 may be configured to facilitate connection 1560 to host computer 1510. Connection 1560 may be direct or it may pass through a core network (not shown in FIG. 15) of the telecommunication system and/or through one or more intermediate networks outside the telecommunication system. In the embodiment shown, hardware 1525 of base station 1520 further includes processing circuitry 1528, which may comprise one or more programmable processors, application-specific integrated circuits, field programmable gate arrays or combinations of these (not shown) adapted to execute instructions. Base station 1520 further has software 1521 stored internally or accessible via an external connection.

Communication system 1500 further includes UE 1530 already referred to. Its hardware 1535 may include radio interface 1537 configured to set up and maintain wireless connection 1570 with a base station serving a coverage area in which UE 1530 is currently located. Hardware 1535 of UE 1530 further includes processing circuitry 1538, which may comprise one or more programmable processors, application-specific integrated circuits, field programmable gate arrays or combinations of these (not shown) adapted to execute instructions. UE 1530 further comprises software 1531, which is stored in or accessible by UE 1530 and executable by processing circuitry 1538. Software 1531 includes client application 1532. Client application 1532 may be operable to provide a service to a human or non-human user via UE 1530, with the support of host computer 1510. In host computer 1510, an executing host application 1512 may communicate with the executing client application 1532 via OTT connection 1550 terminating at UE 1530 and host computer 1510. In providing the service to the user, client application 1532 may receive request data from host application 1512 and provide user data in response to the request data. OTT connection 1550 may transfer both the request data and the user data. Client application 1532 may interact with the user to generate the user data that it provides.

It is noted that host computer 1510, base station 1520 and UE 1530 illustrated in FIG. 15 may be similar or identical to host computer 1430, one of base stations 1412a, 1412b, 1412c and one of UEs 1491, 1492 of FIG. 14, respectively. This is to say, the inner workings of these entities may be as shown in FIG. 15 and independently, the surrounding network topology may be that of FIG. 14. In FIG. 15, OTT connection 1550 has been drawn abstractly to illustrate the communication between host computer 1510 and UE 1530 via base station 1520, without explicit reference to any intermediary devices and the precise routing of messages via these devices. Network infrastructure may determine the routing, which it may be configured to hide from UE 1530 or from the service provider operating host computer 1510, or both. While OTT connection 1550 is active, the network infrastructure may further take decisions by which it dynamically changes the routing (e.g., on the basis of load balancing consideration or reconfiguration of the network).

Wireless connection 1570 between UE 1530 and base station 1520 is in accordance with the teachings of the embodiments described throughout this disclosure. One or more of the various embodiments improve the performance of OTT services provided to UE 1530 using OTT connection 1550, in which wireless connection 1570 forms the last segment. More precisely, the teachings of these embodiments may improve the data rate and power consumption, and thereby provide benefits such as reduced user waiting time and extended battery lifetime.

A measurement procedure may be provided for the purpose of monitoring data rate, latency and other factors on which the one or more embodiments improve. There may further be an optional network functionality for reconfiguring OTT connection 1550 between host computer 1510 and UE 1530, in response to variations in the measurement results. The measurement procedure and/or the network functionality for reconfiguring OTT connection 1550 may be implemented in software 1511 and hardware 1515 of host computer 1510 or in software 1531 and hardware 1535 of UE 1530, or both. In embodiments, sensors (not shown) may be deployed in or in association with communication devices through which OTT connection 1550 passes; the sensors may participate in the measurement procedure by supplying values of the monitored quantities exemplified above, or supplying values of other physical quantities from which software 1511, 1531 may compute or estimate the monitored quantities. The reconfiguring of OTT connection 1550 may include message format, retransmission settings, preferred routing etc.; the reconfiguring need not affect base station 1520, and it may be unknown or imperceptible to base station 1520. Such procedures and functionalities may be known and practiced in the art. In certain embodiments, measurements may involve proprietary UE signaling facilitating host computer 1510's measurements of throughput, propagation times, latency and the like. The measurements may be implemented in that software 1511 and 1531 causes messages to be transmitted, in particular empty or 'dummy' messages, using OTT connection 1550 while it monitors propagation times, errors etc.

FIG. 16 is a flowchart illustrating a method implemented in a communication system including a host computer, a base station and a user equipment in accordance with some embodiments.

The communication system includes a host computer, a base station and a UE which may be those described with reference to FIGS. 14 and 15. For simplicity of the present disclosure, only drawing references to FIG. 16 will be included in this section. In step 1610, the host computer provides user data. In substep 1611 (which may be optional) of step 1610, the host computer provides the user data by executing a host application. In step 1620, the host computer initiates a transmission carrying the user data to the UE. In step 1630 (which may be optional), the base station transmits to the UE the user data which was carried in the transmission that the host computer initiated, in accordance with the teachings of the embodiments described throughout this disclosure. In step 1640 (which may also be optional), the UE executes a client application associated with the host application executed by the host computer.

FIG. 17 is a flowchart illustrating a method implemented in a communication system, in accordance with one embodiment. The communication system includes a host computer, a base station and a UE which may be those described with reference to FIGS. 14 and 15. For simplicity of the present disclosure, only drawing references to FIG. 17 will be included in this section. In step 1710 of the method, the host computer provides user data. In an optional substep (not shown) the host computer provides the user data by executing a host application. In step 1720, the host computer initiates a transmission carrying the user data to the UE. The transmission may pass via the base station, in accordance with the teachings of the embodiments described throughout this disclosure. In step 1730 (which may be optional), the UE receives the user data carried in the transmission.

Figure 18:
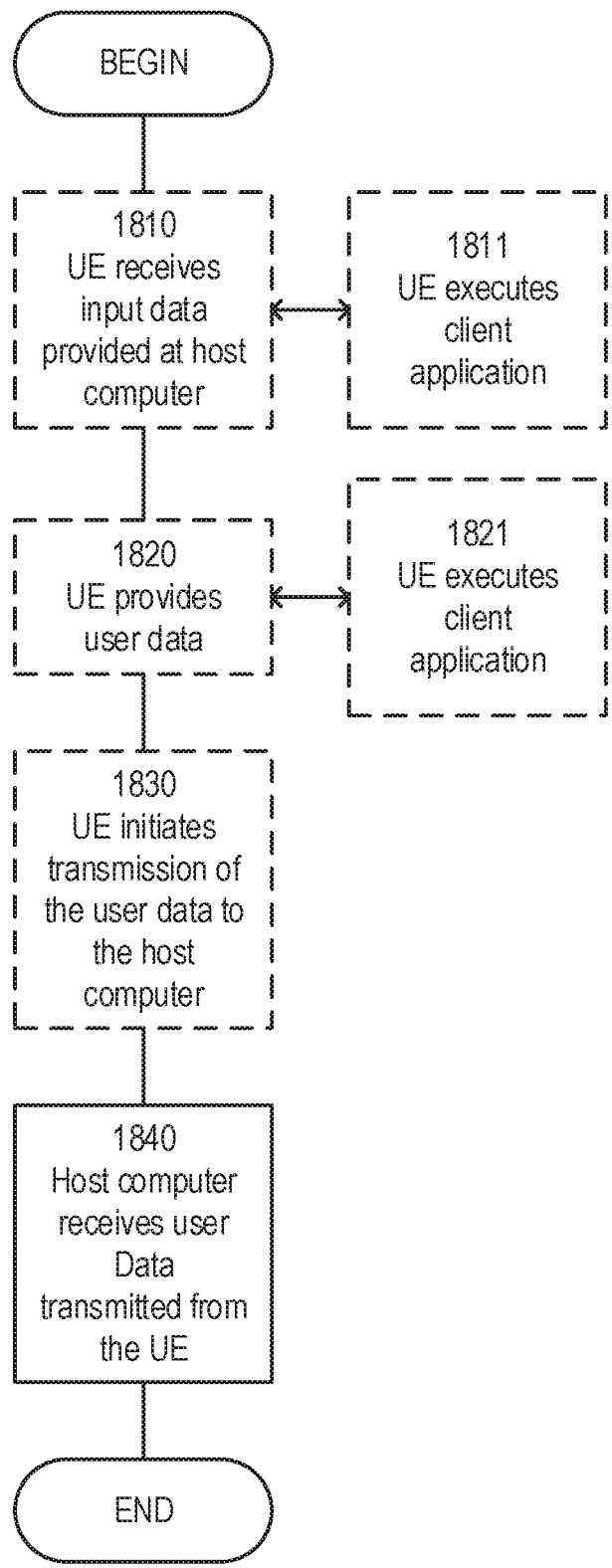
FIG. 18 is a flow chart, illustrating a method in accordance with the disclosure.

FIG. 18 is a flowchart illustrating a method implemented in a communication system, in accordance with one embodiment. The communication system includes a host computer, a base station and a UE which may be those described with reference to FIGS. 14 and 15. For simplicity of the present disclosure, only drawing references to FIG. 18 will be included in this section. In step 1810 (which may be optional), the UE receives input data provided by the host computer. Additionally or alternatively, in step 1820, the UE provides user data. In substep 1821 (which may be optional) of step 1820, the UE provides the user data by executing a client application. In substep 1811 (which may be optional) of step 1810, the UE executes a client application which provides the user data in reaction to the received input data provided by the host computer. In providing the user data, the executed client application may further consider user input received from the user. Regardless of the specific manner in which the user data was provided, the UE initiates, in substep 1830 (which may be optional), transmission of the user data to the host computer. In step 1840 of the method, the host computer receives the user data transmitted from the UE, in accordance with the teachings of the embodiments described throughout this disclosure.

Figure 19:
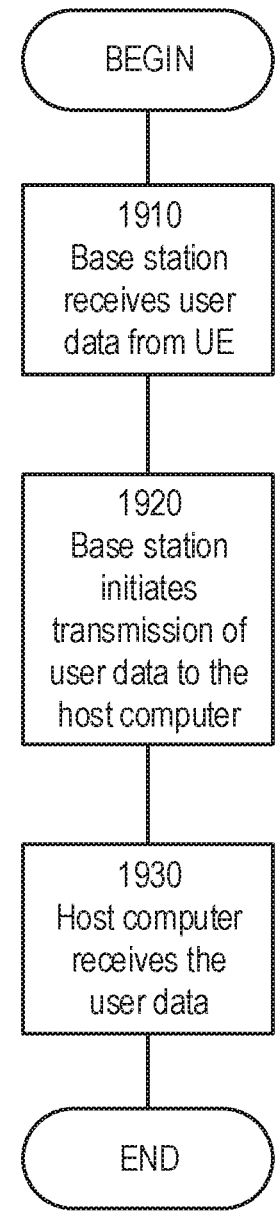
FIG. 19 is a flow chart, illustrating a method in accordance with the disclosure.

FIG. 19 is a flowchart illustrating a method implemented in a communication system, in accordance with one embodiment. The communication system includes a host computer, a base station and a UE which may be those described with reference to FIGS. 14 and 15. For simplicity of the present disclosure, only drawing references to FIG. 19 will be included in this section. In step 1910 (which may be optional), in accordance with the teachings of the embodiments described throughout this disclosure, the base station receives user data from the UE. In step 1920 (which may be optional), the base station initiates transmission of the received user data to the host computer. In step 1930 (which may be optional), the host computer receives the user data carried in the transmission initiated by the base station.

Figure 20:
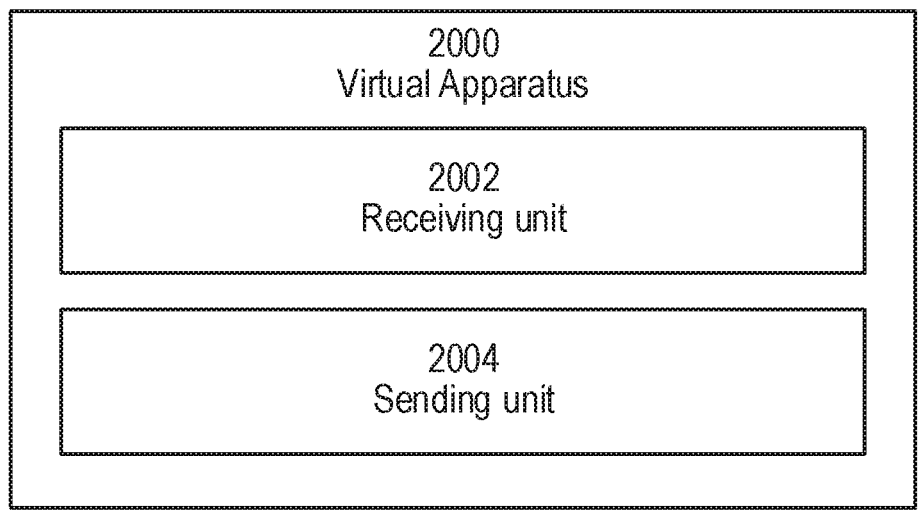
FIG. 20 illustrates a network node in accordance with the disclosure.

FIG. 20 is a schematic block diagram of an apparatus 2000 in a wireless network (for example, the wireless network shown in FIG. 11). The apparatus may be implemented in a wireless device or network node (e.g., wireless device 1110 or network node 1160 shown in FIG. 11). Apparatus 2000 is operable to carry out the example method described with reference to FIG. 9 and possibly any other processes or methods disclosed herein. It is also to be understood that the method of FIG. 9 is not necessarily carried out solely by apparatus 2000. At least some operations of the method can be performed by one or more other entities.

Virtual Apparatus 2000 may comprise processing circuitry, which may include one or more microprocessor or microcontrollers, as well as other digital hardware, which may include digital signal processors (DSPs), special-purpose digital logic, and the like. The processing circuitry may be configured to execute program code stored in memory, which may include one or several types of memory such as read-only memory (ROM), random-access memory, cache memory, flash memory devices, optical storage devices, etc. Program code stored in memory includes program instructions for executing one or more telecommunications and/or data communications protocols as well as instructions for carrying out one or more of the techniques described herein, in several embodiments. In some implementations, the processing circuitry may be used to cause receiving unit 2002, and sending unit 2004, and any other suitable units of apparatus 2000 to perform corresponding functions according one or more embodiments of the present disclosure.

As illustrated in FIG. 20, apparatus 2000 includes receiving unit 2002, and sending unit 2004. The receiving unit 2002 is configured for receiving a notification from the secondary node that it will perform a secondary node amendment procedure; and the sending unit 2004 is configured for sending a message to the secondary node in response to said notification, wherein said message includes gap configuration information.

The term unit may have conventional meaning in the field of electronics, electrical devices and/or electronic devices and may include, for example, electrical and/or electronic circuitry, devices, modules, processors, memories, logic solid state and/or discrete devices, computer programs or instructions for carrying out respective tasks, procedures, computations, outputs, and/or displaying functions, and so on, as such as those that are described herein.

Figure 21:
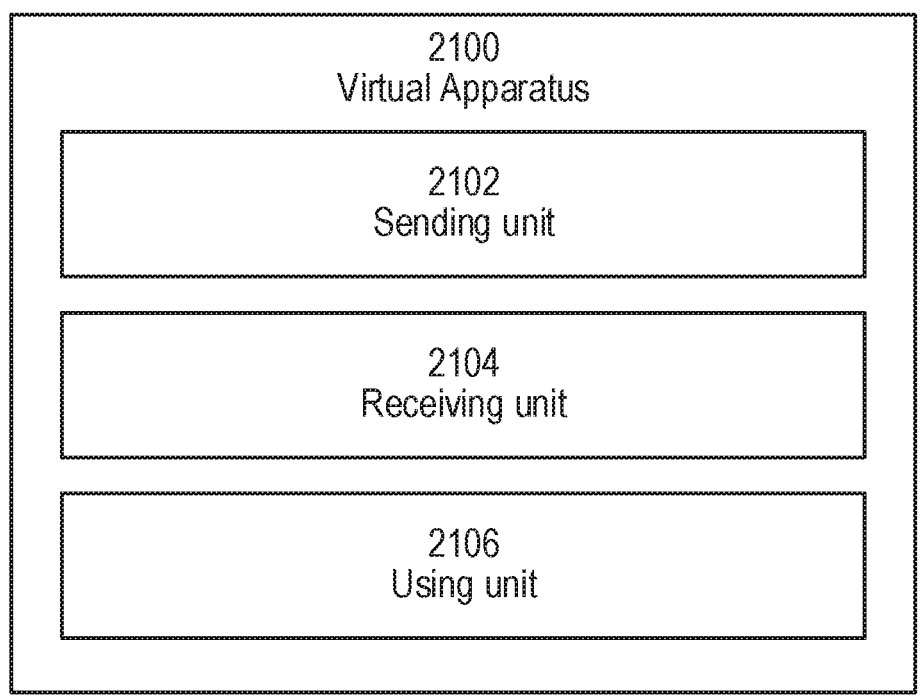
FIG. 21 illustrates a network node in accordance with the disclosure.

FIG. 21 illustrates a schematic block diagram of an apparatus 2100 in a wireless network (for example, the wireless network shown in FIG. 11). The apparatus may be implemented in a wireless device or network node (e.g., wireless device 1110 or network node 1160 shown in FIG. 11). Apparatus 2100 is operable to carry out the example method described with reference to FIG. 10 and possibly any other processes or methods disclosed herein. It is also to be understood that the method of FIG. 10 is not necessarily carried out solely by apparatus 2100. At least some operations of the method can be performed by one or more other entities. Virtual Apparatus 2100 may comprise processing circuitry, which may include one or more microprocessor or microcontrollers, as well as other digital hardware, which may include digital signal processors (DSPs), special-purpose digital logic, and the like. The processing circuitry may be configured to execute program code stored in memory, which may include one or several types of memory such as read-only memory (ROM), random-access memory, cache memory, flash memory devices, optical storage devices, etc. Program code stored in memory includes program instructions for executing one or more telecommunications and/or data communications protocols as well as instructions for carrying out one or more of the techniques described herein, in several embodiments. In some implementations, the processing circuitry may be used to cause sending unit 2102, receiving unit 2104, and using unit 2106, and any other suitable units of apparatus 2100 to perform corresponding functions according one or more embodiments of the present disclosure.

As illustrated in FIG. 21, apparatus 2100 includes sending unit 2120, receiving unit 2104, and using unit 2106. Sending unit 2102 is configured to send a notification to the master node that it will perform a secondary node amendment procedure; receiving unit 2104 is configured to receive a message from the master node in response to said notification, wherein said message includes gap configuration information; and using unit 2106 is configured to use said gap configuration information in communications with a wireless device.

The term unit may have conventional meaning in the field of electronics, electrical devices and/or electronic devices and may include, for example, electrical and/or electronic circuitry, devices, modules, processors, memories, logic solid state and/or discrete devices, computer programs or instructions for carrying out respective tasks, procedures, computations, outputs, and/or displaying functions, and so on, as such as those that are described herein.

ABBREVIATIONS

At least some of the following abbreviations may be used in this disclosure. If there is an inconsistency between abbreviations, preference should be given to how it is used above. If listed multiple times below, the first listing should be preferred over any subsequent listing(s).
1×RTT CDMA2000 1× Radio Transmission Technology
3GPP 3rd Generation Partnership Project
5G 5th Generation
ABS Almost Blank Subframe
ARQ Automatic Repeat Request
AWGN Additive White Gaussian Noise
BCCH Broadcast Control Channel
BCH Broadcast Channel
CA Carrier Aggregation
CC Carrier Component
CCCH SDU Common Control Channel SDU
CDMA Code Division Multiplexing Access
CGI Cell Global Identifier
CIR Channel Impulse Response
CP Cyclic Prefix
CPICH Common Pilot Channel
CPICH Ec/No CPICH Received energy per chip divided by the power density in the band
CQI Channel Quality information
C-RNTI Cell RNTI CSI Channel State Information
DCCH Dedicated Control Channel
DL Downlink
DM Demodulation
DMRS Demodulation Reference Signal
DRX Discontinuous Reception
DTX Discontinuous Transmission
DTCH Dedicated Traffic Channel
DUT Device Under Test
E-CID Enhanced Cell-ID (positioning method)
E-SMLC Evolved-Serving Mobile Location Centre
ECGI Evolved CGI
eNB E-UTRAN NodeB
ePDCCH enhanced Physical Downlink Control Channel
E-SMLC evolved Serving Mobile Location Center
E-UTRA Evolved UTRA
E-UTRAN Evolved UTRAN
FDD Frequency Division Duplex
FFS For Further Study
GERAN GSM EDGE Radio Access Network
gNB Base station in NR
GNSS Global Navigation Satellite System
GSM Global System for Mobile communication
HARQ Hybrid Automatic Repeat Request
HO Handover
HSPA High Speed Packet Access
HRPD High Rate Packet Data
LOS Line of Sight
LPP LTE Positioning Protocol
LTE Long-Term Evolution
MAC Medium Access Control
MBMS Multimedia Broadcast Multicast Services
MBSFN Multimedia Broadcast multicast service Single Frequency Network
MBSFN ABS MBSFN Almost Blank Subframe
MDT Minimization of Drive Tests
MIB Master Information Block
MME Mobility Management Entity
MSC Mobile Switching Center
NPDCCH Narrowband Physical Downlink Control Channel
NR New Radio
OCNG OFDMA Channel Noise Generator
OFDM Orthogonal Frequency Division Multiplexing
OFDMA Orthogonal Frequency Division Multiple Access
OSS Operations Support System
OTDOA Observed Time Difference of Arrival
O&M Operation and Maintenance
PBCH Physical Broadcast Channel
P-CCPCH Primary Common Control Physical Channel
PCell Primary Cell
PCFICH Physical Control Format Indicator Channel
PDCCH Physical Downlink Control Channel
PDP Profile Delay Profile
PDSCH Physical Downlink Shared Channel
PGW Packet Gateway
PHICH Physical Hybrid-ARQ Indicator Channel
PLMN Public Land Mobile Network
PMI Precoder Matrix Indicator
PRACH Physical Random Access Channel
PRS Positioning Reference Signal
PSS Primary Synchronization Signal
PUCCH Physical Uplink Control Channel
PUSCH Physical Uplink Shared Channel
RACH Random Access Channel
QAM Quadrature Amplitude Modulation
RAN Radio Access Network
RAT Radio Access Technology
RLM Radio Link Management
RNC Radio Network Controller
RNTI Radio Network Temporary Identifier
RRC Radio Resource Control
RRM Radio Resource Management
RS Reference Signal
RSCP Received Signal Code Power
RSRP Reference Symbol Received Power OR Reference Signal Received Power
RSRQ Reference Signal Received Quality OR Reference Symbol Received Quality
RSSI Received Signal Strength Indicator
RSTD Reference Signal Time Difference
SCH Synchronization Channel
SCell Secondary Cell
SDU Service Data Unit
SFN System Frame Number
SGW Serving Gateway
SI System Information
SIB System Information Block
SNR Signal to Noise Ratio
SON Self Optimized Network
SS Synchronization Signal
SSS Secondary Synchronization Signal
TDD Time Division Duplex
TDOA Time Difference of Arrival
TOA Time of Arrival
TSS Tertiary Synchronization Signal
TTI Transmission Time Interval
UE User Equipment
UL Uplink
UMTS Universal Mobile Telecommunication System
USIM Universal Subscriber Identity Module
UTDOA Uplink Time Difference of Arrival
UTRA Universal Terrestrial Radio Access
UTRAN Universal Terrestrial Radio Access Network
WCDMA Wide CDMA
WLAN Wide Local Area Network

The invention claimed is:

1. A method for measurement gap configuration performed by a network node operating as a master node (MN) in dual connectivity with a secondary node (SN), the method comprising:
receiving a notification from the secondary node that it will perform a secondary node modification procedure;
determining that a measurement gap configuration or reconfiguration is required; and
sending a response message to the secondary node in response to said notification, wherein the response message includes new measurement gap configuration information and maximum allowed number of measurement information.

2. The method of claim 1, wherein the response message is sent to the secondary node only if it is determined that a measurement gap configuration or reconfiguration is required.

3. The method of claim 1, wherein said notification is a Secondary node Modification Required message.

4. The method of claim 1, wherein said notification is a Secondary node Modification Request Acknowledge message.

5. The method of claim 1, wherein the response message is a secondary node Modification Confirm message.

6. The method of claim 1, wherein the response message is a secondary node Modification Request message.

7. The method of claim 4, wherein the response message is a secondary Node Reconfiguration Complete message.

8. The method of claim 1, further comprising performing a Radio Resource Control reconfiguration procedure with a wireless device that includes the new measurement gap configuration information.

9. The method of claim 1, wherein the new measurement gap configuration information comprises a gap duration.

10. The method of claim 1, wherein the new measurement gap configuration information comprises a gap configuration with a long gap duration based on several NR measurements.

11. A method for measurement gap configuration performed by a network node operating as a secondary node (SN) in dual connectivity with a master node (MN), the method comprising:
 sending a notification to the master node that the network node will perform a secondary node modification procedure;
 receiving a response message from the master node in response to said notification, wherein said response message includes new measurement gap configuration information and maximum allowed number of measurement information; and
 using said new measurement gap configuration information in communications with a wireless device.

12. The method of claim 11, wherein said notification is a Secondary node Modification Required message.

13. The method of claim 11, wherein said notification is a Secondary node Modification Request Acknowledge message.

14. The method of claim 11, wherein the response message is a secondary node Modification Confirm message.

15. The method of claim 11, wherein the response message is a secondary node Modification Request message.

16. The method of claim 13, wherein the response message is a secondary node Reconfiguration Complete message.

17. The method of claim 11, further comprising:
 after determining that the network node will perform a secondary node modification procedure, pausing transmissions to a wireless device operating in dual connectivity with the network node and the master node; and
 resuming transmissions to said wireless device after receiving the response message from the master node.

18. The method of claim 11, wherein the gap configuration information comprises a gap duration.

19. A network node comprising:
 transceiver circuitry configured to communicate with at least one other network node; and
 a processor operably coupled with the transceiver circuitry, whereby the combination of the processor and the transceiver circuitry are configured to perform operations corresponding to a method for measurement gap configuration performed by a network node operating as a master node (MN) in dual connectivity with a secondary node (SN), the method comprising:
 receiving a notification from the secondary node that it will perform a secondary node modification procedure;
 determining that a measurement gap configuration or reconfiguration is required; and
 sending a response message to the secondary node in response to said notification, wherein the response message includes new measurement gap configuration information and maximum allowed number of measurement information.

* * * * *